United States Patent
Maheshwari

(10) Patent No.: US 9,836,416 B2
(45) Date of Patent: Dec. 5, 2017

(54) MEMORY DEVICES AND SYSTEMS INCLUDING MULTI-SPEED ACCESS OF MEMORY MODULES

(71) Applicant: Cypress Semiconductor Corporation, San Jose, CA (US)

(72) Inventor: Dinesh Maheshwari, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 107 days.

(21) Appl. No.: 14/275,491

(22) Filed: May 12, 2014

(65) Prior Publication Data

US 2014/0281200 A1    Sep. 18, 2014

Related U.S. Application Data

(63) Continuation of application No. 12/818,304, filed on Jun. 18, 2010, now Pat. No. 8,725,983, which is a continuation-in-part of application No. 12/577,695, filed on Oct. 12, 2009, now Pat. No. 8,572,320.

(60) Provisional application No. 61/218,286, filed on Jun. 18, 2009, provisional application No. 61/220,177, filed on Jun. 24, 2009, provisional application No.
(Continued)

(51) Int. Cl.
| | |
|---|---|
| G06F 13/16 | (2006.01) |
| G06F 13/42 | (2006.01) |
| G06F 12/1072 | (2016.01) |
| G06F 12/08 | (2016.01) |
| G11C 11/406 | (2006.01) |
| G06F 12/0862 | (2016.01) |

(52) U.S. Cl.
CPC ......... *G06F 13/1689* (2013.01); *G06F 12/08* (2013.01); *G06F 12/1072* (2013.01); *G06F 13/1673* (2013.01); *G06F 13/4243* (2013.01); *G11C 11/40615* (2013.01); *G06F 12/0862* (2013.01); *G06F 2212/305* (2013.01)

(58) Field of Classification Search
None
See application file for complete search history.

(56) References Cited

U.S. PATENT DOCUMENTS

| | | |
|---|---|---|
| 6,530,007 B2 | 3/2003 | Olarig et al. |
| 7,286,436 B2 | 10/2007 | Bhakta et al. |

(Continued)

FOREIGN PATENT DOCUMENTS

| | | |
|---|---|---|
| WO | 2007002324 A | 1/2007 |
| WO | 2007028109 A2 | 3/2007 |
| WO | 2007095080 A2 | 8/2007 |

OTHER PUBLICATIONS

U.S. Appl. No. 12/577,695: "Memory Devices and Systems Including Cache Devices for Memory Modules," Dinesh Maheshwari, filed on Oct. 12, 2009; 90 pages.
(Continued)

*Primary Examiner* — Midys Rojas

(57) ABSTRACT

A system, comprising: a plurality of modules, each module comprising a plurality of integrated circuits devices coupled to a module bus and a channel interface that communicates with a memory controller, at least a first module having a portion of its total module address space composed of first type memory cells having a first maximum access speed, and at least a second module having a portion of its total module address space composed of second type memory cells having a second maximum access speed slower than the first access speed.

20 Claims, 13 Drawing Sheets

Related U.S. Application Data

61/248,723, filed on Oct. 5, 2009, provisional application No. 61/167,856, filed on Apr. 8, 2009, provisional application No. 61/158,680, filed on Mar. 9, 2009, provisional application No. 61/147,046, filed on Jan. 23, 2009, provisional application No. 61/167,969, filed on Apr. 9, 2009.

(56) References Cited

U.S. PATENT DOCUMENTS

| | | |
|---|---|---|
| 7,289,386 B2 | 10/2007 | Bhakta et al. |
| 7,307,863 B2 | 12/2007 | Yen et al. |
| 7,379,316 B2 | 5/2008 | Rajan |
| 7,479,799 B2 | 1/2009 | Raghavan et al. |
| 7,532,537 B2 | 5/2009 | Solomon et al. |
| 7,571,295 B2 | 8/2009 | Sakarda et al. |
| 7,721,865 B2 | 5/2010 | Tominaga et al. |
| 2002/0002662 A1 | 1/2002 | Olarig et al. |
| 2003/0061458 A1 | 3/2003 | Wilcox et al. |
| 2004/0064648 A1 | 4/2004 | Brown et al. |
| 2004/0073749 A1 | 4/2004 | Parthasarathy et al. |
| 2005/0146973 A1 | 7/2005 | Schoenfeld |
| 2006/0015772 A1 | 1/2006 | Ang et al. |
| 2006/0129741 A1 | 6/2006 | Hillier et al. |
| 2007/0033367 A1 | 2/2007 | Sakarda et al. |
| 2007/0058410 A1 | 3/2007 | Rajan |
| 2007/0204075 A1 | 8/2007 | Rajan et al. |
| 2007/0260818 A1 | 11/2007 | Damaraju et al. |
| 2008/0010435 A1 | 1/2008 | Smith et al. |
| 2008/0028135 A1 | 1/2008 | Rajan et al. |
| 2008/0028137 A1 | 1/2008 | Schakel et al. |
| 2008/0077732 A1 | 3/2008 | Risse |
| 2008/0082750 A1 | 4/2008 | Okin et al. |
| 2008/0082753 A1 | 4/2008 | Licht et al. |
| 2008/0103753 A1 | 5/2008 | Rajan et al. |
| 2008/0104314 A1 | 5/2008 | Rajan et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1 | 5/2008 | Schakel et al. |
| 2008/0115006 A1 | 5/2008 | Smith et al. |
| 2008/0120443 A1 | 5/2008 | Rajan et al. |
| 2008/0126624 A1 | 5/2008 | Prete et al. |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126692 A1 | 5/2008 | Rajan et al. |
| 2008/0133825 A1 | 6/2008 | Rajan et al. |
| 2008/0170425 A1 | 7/2008 | Rajan |
| 2009/0006756 A1 | 1/2009 | Donley |
| 2009/0024789 A1 | 1/2009 | Rajan et al. |
| 2009/0024790 A1 | 1/2009 | Rajan et al. |
| 2009/0103345 A1 | 4/2009 | Mclaren et al. |
| 2010/0023674 A1 | 1/2010 | Aviles |
| 2010/0077240 A1 | 3/2010 | Daga et al. |
| 2010/0095048 A1 | 4/2010 | Bechtolsheim et al. |
| 2010/0106904 A1 | 4/2010 | Berke et al. |

OTHER PUBLICATIONS

U.S. Appl. No. 12/818,304, "Memory Devices and Systems Including Multi-Speed Access of Memory Modules", Filed on Jun. 18, 2010; 59 pages.

Bruce Jacob, U. Maryland, "Appraisal of Cypress Semiconductor's Cached LR-DIMM Proposal." http://www.ece.umd.edu/˜blj dated May 21, 2009; 12 pages.

Ganesh et al., "Fully-Buffered DIMM Memory Architectures: Understanding Mechanisms, Overheads and Scaling," IEEE 13th International Symposium on High-Performance Computer Architecture (HPCA 2007), Feb. 13, 2007, Phoeniz, Arizona.

Intel, An Overview of Cache, Feb. 11, 2007, Available at: http://web.archive.org/web/20070211091515/http://download.intel.com/design/intarch/papers/cache6.pdf.

International Search Report for International Application No. PCT/US10/39262 dated Nov. 17, 2010; 2 pages.

USPTO Advisory Action for U.S. Appl. No. 12/577,695 dated Jul. 30, 2012; 3 pages.

USPTO Final Rejection for U.S. Appl. No. 12/577,695 dated May 16, 2012; 20 pages.

USPTO Non Final Rejection for U.S. Appl. No. 12/577,695 dated Jan. 27, 2012; 15 pages.

USPTO Non-Final Rejection for U.S. Appl. No. 12/577,695 dated Aug. 27, 2012; 18 pages.

USPTO Non-Final Rejection for U.S. Appl. No. 12/818,304 dated Oct. 3, 2012; 26 pages.

USPTO Notice of Allowance for U.S. Appl. No. 12/577,695 dated Jan. 3, 2013; 11 pages.

USPTO Notice of Allowance for U.S. Appl. No. 12/577,695 dated Mar. 12, 2013; 10 pages.

USPTO Notice of Allowance for U.S. Appl. No. 12/577,695 dated Aug. 30, 2013; 11 pages.

USPTO Notice of Allowance for U.S. Appl. No. 12/818,304 dated Feb. 28, 2013; 8 pages.

USPTO Notice of Allowance for U.S. Appl. No. 12/818,304 dated Feb. 28, 2014; 5 pages.

USPTO Requirement for Restriction for U.S. Appl. No. 12/818,304 dated Jan. 25, 2013; 7 pages.

Written Opinion of the International Searching Authority for International Application No. PCT/US10/39262 mailed Nov. 17, 2010; 6 pages.

USPTO Advisory Action for U.S. Appl. No. 14/066,522 dated Sep. 10, 2015; 3 pages.

USPTO Final Rejection for U.S. Appl. No. 14/066,522 dated May 28, 2015; 19 pages.

USPTO Non-Final Rejection for U.S. Appl. No. 14/066,522 dated Feb. 13, 2015; 11 pages.

USPTO Notice of Allowance for U.S. Appl. No. 14/066,522 dated Mar. 4, 2016; 5 pages.

USPTO Notice of Allowance for U.S. Appl. No. 14/066,522 dated Nov. 16, 2015; 10 pages.

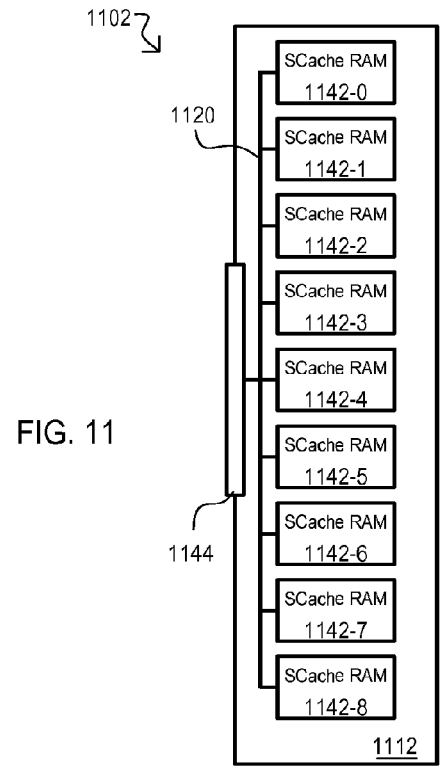
FIG. 11
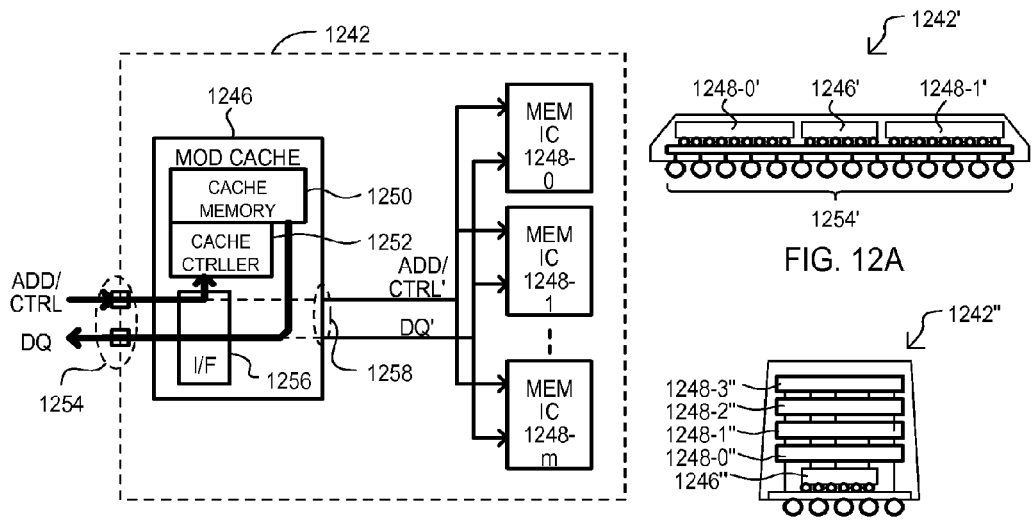
FIG. 12
FIG. 12A
FIG. 12B

MEMORY DEVICES AND SYSTEMS INCLUDING MULTI-SPEED ACCESS OF MEMORY MODULES

This application is a continuation of U.S. patent application Ser. No. 12/818,304, filed Jun. 18, 2010, which claims the benefit of the following U.S. Provisional Patent Applications: Ser. No. 61/220,177, filed on Jun. 24, 2009, Ser. No. 61/218,286, filed on Jun. 18, 2009, and Ser. No. 61/248,723 filed on Oct. 5, 2009, all of which are incorporated by reference herein in their entirety.

U.S. patent application Ser. No. 12/818,304, filed Jun. 18, 2010, is also a continuation-in-part of U.S. patent application Ser. No. 12/577,695, filed on Oct. 12, 2009, now U.S. Pat. No. 8,572,320, issued on Oct. 29, 2013, which claims the benefit of the following U.S. Provisional Patent Applications: Ser. No. 61/147,046 filed on Jan. 23, 2009, Ser. No. 61/158,680 filed on Mar. 9, 2009, Ser. No. 61/167,856 filed on Apr. 8, 2009, and Ser. No. 61/167,969 filed on Apr. 9, 2009, all of which are incorporated by reference herein in their entirety.

TECHNICAL FIELD

The present disclosure relates generally to memory devices, and more particularly to a memory modules and circuits related to such modules.

BRIEF DESCRIPTION OF THE DRAWINGS

FIG. 11 is a block schematic diagram of a stacked cache device memory module according to an embodiment.

FIG. 12 is a block schematic diagram of a stacked cache memory package that may be included in a stacked cache device memory module according to an embodiment. FIGS. 12A and 12B are side cross sectional views of stacked cache memory devices according to embodiments.

DETAILED DESCRIPTION

Figure 1:
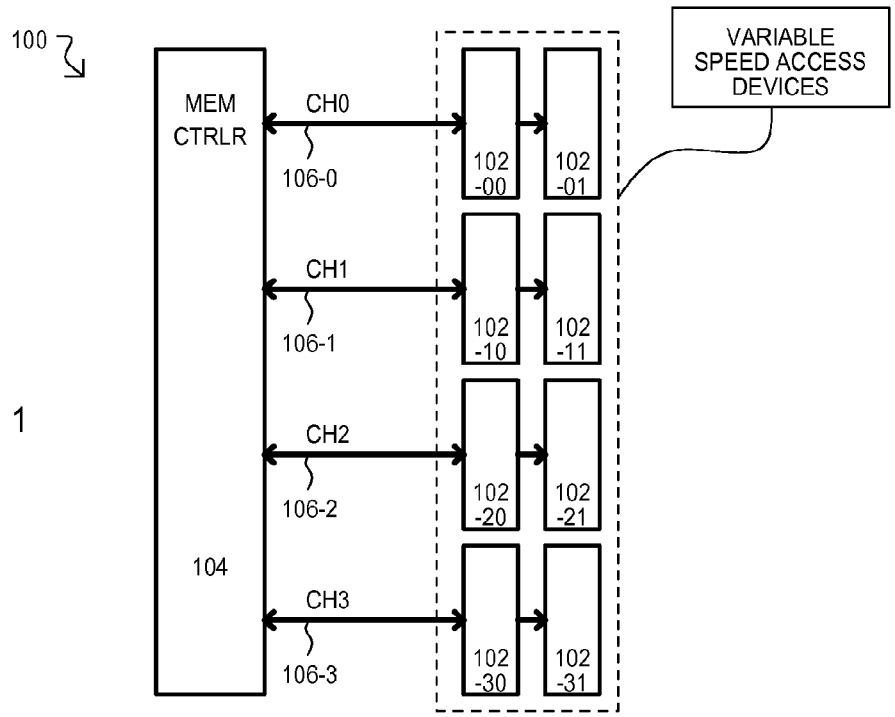
FIG. 1 is a block schematic diagram of a system according to an embodiment.

Various embodiments will now be described that show circuits, integrated circuit devices (ICs), modules containing ICs, and systems including modules, as well as corresponding methods related to the operations of such circuits, devices and systems. In the following description, like sections are referred to by the same reference character but with the first digit(s) corresponding to the figure number.

Referring to FIG. 1, a system according to an embodiment is shown in a block schematic diagram and designated by the general reference character 100. A system 100 may include a number of memory modules 102-00 to 102-31, each having storage locations accessible by signals from a memory controller 104. Memory modules (102-00 to 102-31) may provide accesses to storage locations at more than one speed. In particular embodiments, for some accesses, a minimum read latency (time between application of a read command and the output of read data) may be smaller than other types of accesses. Similarly, a minimum write latency (time between application of write command and application of write data) may vary between accesses. Such differences may be expressed in clock cycles, in the case of synchronously accessed modules, or may be expressed at a time value, in the case of asynchronously or synchronously accessed modules.

Further, in some embodiments, accesses along channels (106-0 to 106-3) may vary in frequency and/or voltage amplitude.

In the embodiment of FIG. 1, a memory controller 104 may access memory modules (102-00 to 102-31) along a number of channels CH0-3 (106-0 to 106-3). In particular, channel CH0 may access modules 102-00 and -01, channel CH1 may access modules 102-10 and -11, channel CH2 may access modules 102-20 and -21, and channel CH3 may access modules 102-30 and -31.

Variable speed access to modules may differ between embodiments. For example, in some embodiments, accesses along one or more channels may be faster or slower according to which portion of an address space is accessed. That is, a "chunk" of total address space may be buffered for high speed access.

In other embodiments, accesses may be faster along one or more channels in the event a storage location has been cached. That is, one or more cache devices may be present on a module to provide fast access to cached addresses. In contrast, non-cached addresses may be accessed at a standard speed (i.e., relatively slower with respect to a fast access). Still further, in such cached arrangements, cache devices may also enable dynamic scaling of data signal transfer characteristics, including but not limited to frequency and/or voltage scaling. That is, frequencies of data transfers and/or voltage amplitudes of data signals along a channel may be varied in cached system.

In still other embodiments, one channel may only provide access a relatively fast speed, while other channels may provide mixed speeds or only a standard (relatively slower) access speed. That is, one channel may include modules that are "rapid access channel" modules, having memory devices constructed of high speed memory devices.

Referring still to FIG. 1, in very particular embodiments, any of memory modules 102-0- to -31 may include a number of integrated circuit devices mounted on a module circuit board in an in-line fashion. Such a module circuit board may include board connections formed on at least one side of the circuit board to provide a signal connection to a channel (any of 106-0 to -3). In an embodiment like that of FIG. 1, a memory module may be an in-line memory module (IMM), such as a single IMM (SIMM), or a dual IMM (DIMM) in the event connections and memory circuits are formed on both sides of a module circuit board.

In this way, a system may include memory modules that provide variable access speeds to storage locations therein.

Figure 2:
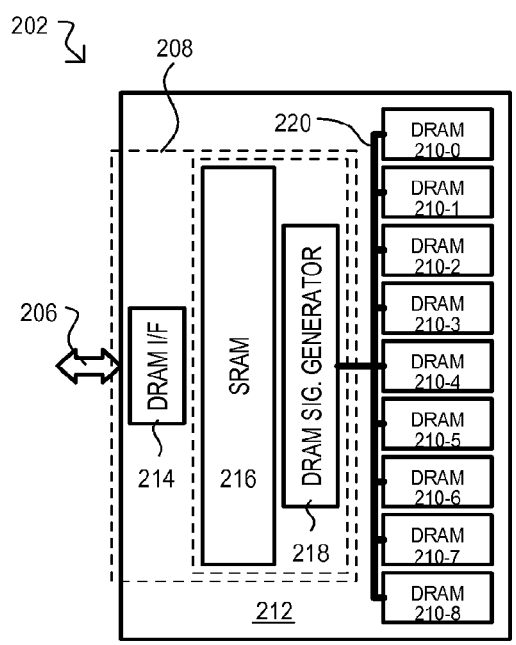
FIG. 2 is a block schematic diagram of a chunk buffer module according to an embodiment.

Referring to FIG. 2, a memory module according to one embodiment is shown in a block schematic diagram and designated by the general reference character 202. Memory module 202 may include a buffer section 208 and a number of standard speed memory integrated circuit (IC) devices 210-0 to -8 formed on a module circuit board 212.

In one particular embodiment, a memory module 202 may be one example of any of those shown as 102-00 to -31 in FIG. 1.

Standard speed memory IC devices 210-0 to -8 may provide access to data storage locations at a standard speed. In the embodiment shown, standard speed memory IC devices (210-0 to -8) may be commonly connected to a module bus 220. A module bus 220 may include address, command and data signal lines for accessing standard speed memory IC devices (210-0 to -8).

A buffer section 208 may include a module interface 214, a high speed memory section 216, and a signal generator circuit 218. A buffer section 208 may provide access to storage locations at a faster speed than standard speed memory IC devices (210-0 to -8). A module interface 214 may include signal connections for communication with a memory controller on a communication channel 206. For example, a module interface 214 may include address connections for receiving address data, control connections for receiving control data (command and/or timing), and data connections for transferring data between module interface 214 and a memory controller (not shown in FIG. 2). A module interface 214 may provide address, control, and data signal paths to both a high speed memory section 216 as well as signal generator circuit 218.

A high speed memory section 216 may include one or more high speed memory IC devices. Such high speed memory IC devices may provide a faster access speed than standard memory IC devices 210-0 to -8. A high speed memory section 216 may receive memory access requests from module interface 214, and receive write data and output read data through module interface 214.

A signal generator circuit 218 may be connected to module interface 214 either directly, or through high speed memory section 216. A signal generator circuit 218 may drive signals on module bus 220 to access standard speed memory IC device 210-0 to -8. In addition, signal generator circuit 218 may provide data on module bus 220 to module interface 214.

In a particular embodiment, standard speed memory IC devices 210-0 to -8 may be dynamic random access memory (DRAM) ICs, while a high speed memory section 216 may include one or more static random access memory (SRAM) ICs. Such SRAM ICs may have faster access speeds than the DRAM ICs. Thus, accesses to buffer section 208 may be faster than accesses to standard speed memory IC devices 210-0 to -8.

Further, in one embodiment, standard speed memory IC devices 210-0 to -8 may be DRAM ICs having a particular DRAM interface. A module interface 214 may be a same interface as DRAM interfaces of such DRAM ICs, and a signal generator circuit 218 may repeat signals received at module interface 214. In a particular embodiment, a DRAM interface may be double data rate (DDR) type interface. A high speed memory section 216 may include SRAM ICs having interfaces compatible with the DRAM interface, or may include circuits that convert DRAM interface signals to signals compatible with a different SRAM interface.

In this way, a memory module may include a number of memory IC devices having standard speed access, and one or more high speed memory devices having access speeds faster than the standard speed devices.

Figure 3:
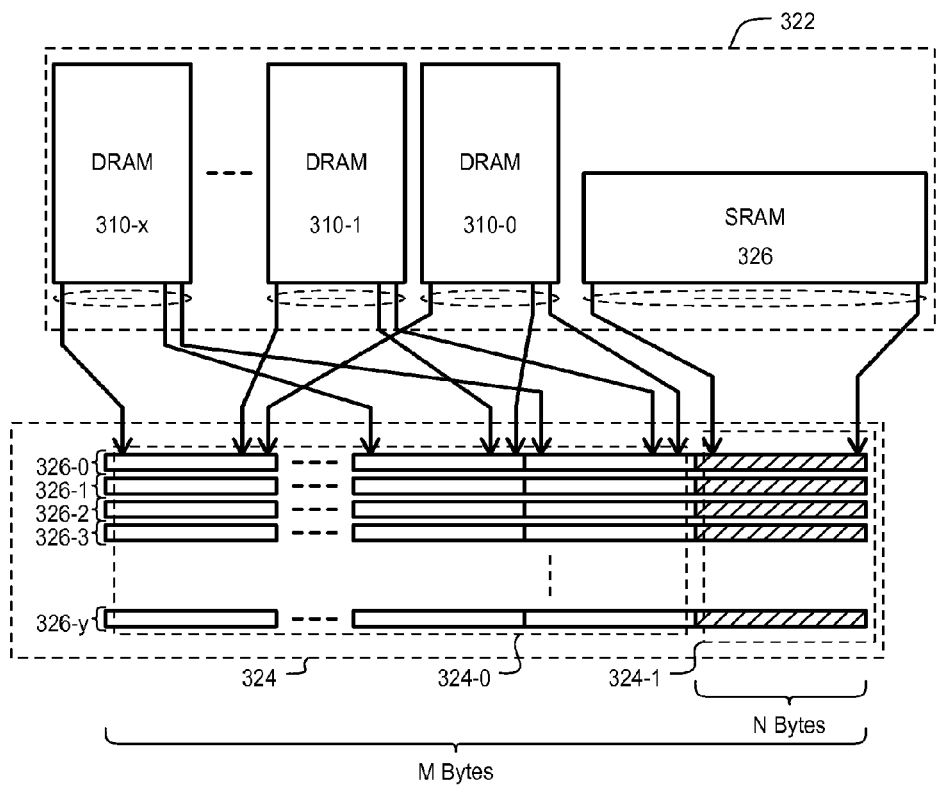
FIG. 3 is a block schematic diagram of a memory space mapping in a chunk buffer module according to an embodiment.

Referring to FIG. 3, a module memory space mapping according to an embodiment is shown in a block diagram. In one embodiment, the memory mapping shown in FIG. 3 may be one example of memory mapping that may include in a module like that of FIG. 2.

FIG. 3 shows module memory devices 322 and how a corresponding module memory space 324 may be accessed. Module memory devices 322 show memory IC devices included on a module having data storage locations accessible by another device (e.g., memory controller). In the embodiment shown, module memory devices 322 may include standard speed memory IC devices 310-0 to 310-x and a high speed memory IC device 326. Alternate embodiments, may include more than one high speed memory IC device.

A module memory space 324 shows an organization of storage locations provided by a module. As shown, a memory space 324 may be divided into two memory space portions 324-0 and 324-1. A first memory space portion 324-0 may physically correspond to storage locations within standard speed memory IC devices (310-0 to 310-x), while a second memory space portion 324-1 may physically correspond to storage locations within high speed memory IC device 326. In the embodiment shown, first and second memory space portions 324-0 and -1 are not overlapping. That is, addresses applied to a module that access a first memory space portion 324-0 are not the same as those that access second memory space portion 324-1. Thus, a second memory space portion 324-1 may be conceptualized as buffering a "chunk" of the total storage available on a module.

In a very particular embodiment, a module memory space 324 may be dividable into a number of memory lines 326-0 to 326-m, each including a number of bytes (M). N bytes of each line (where N<M) may be stored by high speed memory IC device 326.

In one embodiment, standard speed memory IC devices may be DRAMs, while a high speed memory IC device may be an SRAM.

In this way, a module may have a memory space with a portion corresponding to standard speed memory IC devices and another, different portion corresponding to high speed memory IC devices.

Figure 4:
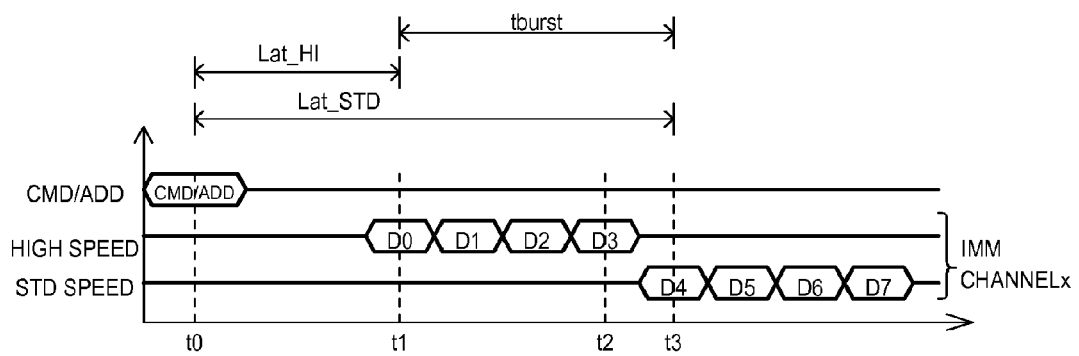
FIG. 4 is a timing diagram showing examples of accesses that may occur in a chunk buffer module according to an embodiment.

Referring to FIG. 4, a timing diagram shows an access operation according to an embodiment. FIG. 4 shows how variable speed accesses may occur over a same channel. Accesses shown by FIG. 4 may be particular examples of memory accesses to a memory module like that shown as 202 in FIG. 2. The timing diagram of FIG. 4 shows a waveform for: command and address data (CMD/ADD) applied to a memory module, data applied or output corresponding to high speed memory devices (HIGH SPEED), and data applied or output corresponding to standard speed memory devices (STD SPEED).

Referring still to FIG. 4, at about time t0, a memory module may receive a command (e.g., read or write) and all, or a portion of an address within the address space of a memory module.

In the event a command/address corresponds to a location within a high speed memory device(s), corresponding data may be output (or input) at a time t1. In FIG. 4, the resulting delay is shown as Lat_HI.

In contrast, in the event a command/address corresponds to a location within a standard speed memory device(s), data for the access may be output (or input) at a time t3, later than time t2. In FIG. 4, the resulting delay is shown as Lat_STD.

In the particular example shown, high speed accesses (i.e., data values D0-D3) and standard speed data accesses (i.e., data values D4-D7) may occur on a same communication channel (IMM CHANNELx).

In one very particular embodiment, data values may be output or input in bursts (e.g., data values may be input/output sequentially). In addition, a burst of data may occur over a time period "tburst" (in the example shown, a burst of four). If a high speed latency and burst time period are greater than or equal to a standard latency (Lat_HI+tburst-≥Lat_STD), a single large burst (D0 to D7) may occur in an uninterrupted fashion that sequentially accesses both fast and standard speed memory devices on a same channel. Such an operation may "hide" a longer latency (Lat_STD) by accessing high speed memory until a standard speed memory access time has passed.

In this way, high and standard speed accesses may be combined to hide a standard latency for particular accesses.

Figure 5:
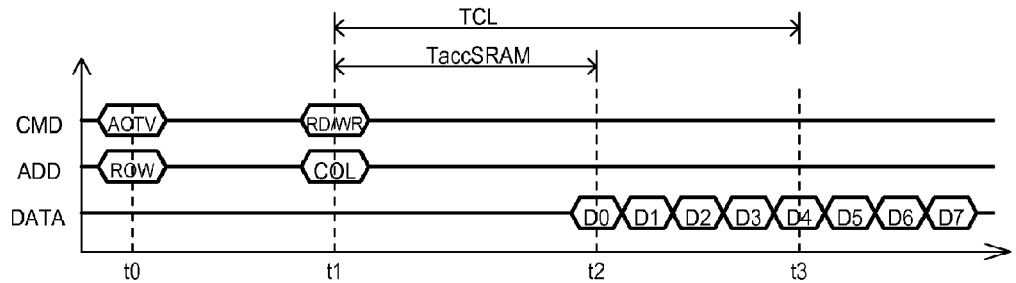
FIG. 5 is a timing diagram showing examples of accesses that may occur in a chunk buffer module according to another embodiment.

Referring to FIG. 5, another timing diagram shows an access operation according to an embodiment. FIG. 5 shows how variable speed accesses may occur over a same channel in a memory module that includes SRAM devices as high speed devices and DRAM devices as standard speed devices. Further, such a module operates according to synchronous DRAM access commands. Accesses shown by FIG. 5 may be particular examples of memory accesses to a memory module like that shown as 202 in FIG. 2.

The timing diagram of FIG. 5 shows a waveform for: command data (CMD), address data (ADD), and data output or applied along a module channel (i.e., read or write data) (DATA).

Referring still to FIG. 5, at about time t0, a memory module may receive an activation command (ACTV) along with a row address (ROW). Within DRAM devices on a module, such a command may open a row. In one embodiment, for SRAM devices, such a row address may be stored for application with subsequent address values.

At about time t1, a memory module may receive an access command (e.g., a read or write command) along with a column address (COL). Within DRAM devices on the module, such a command may start to access storage locations corresponding to the row and column address for availability after a time TCL. In one embodiment, for SRAM device(s), such a column address and command may be applied (along with the previous row address) to access storage locations within SRAM device(s).

At about time t2, after a time TaccSRAM, storage locations may be accessible within SRAM device(s). Consequently, a first portion of a data burst (D0-D3) may be output or input at this time for locations within an SRAM device(s).

At about time t3, after a time TCL, storage locations may be accessible within DRAM device(s). Consequently, a second portion of a data burst (D4-D7) may be output or input at this time for locations within DRAM devices. It is noted that an SRAM data access time TaccSRAM and the time for a corresponding data burst (t2 to t3), may be less than or equal to TCL.

In this way, SRAM device storage locations may be accessed while access to DRAM storage locations is still in progress.

Figure 6:
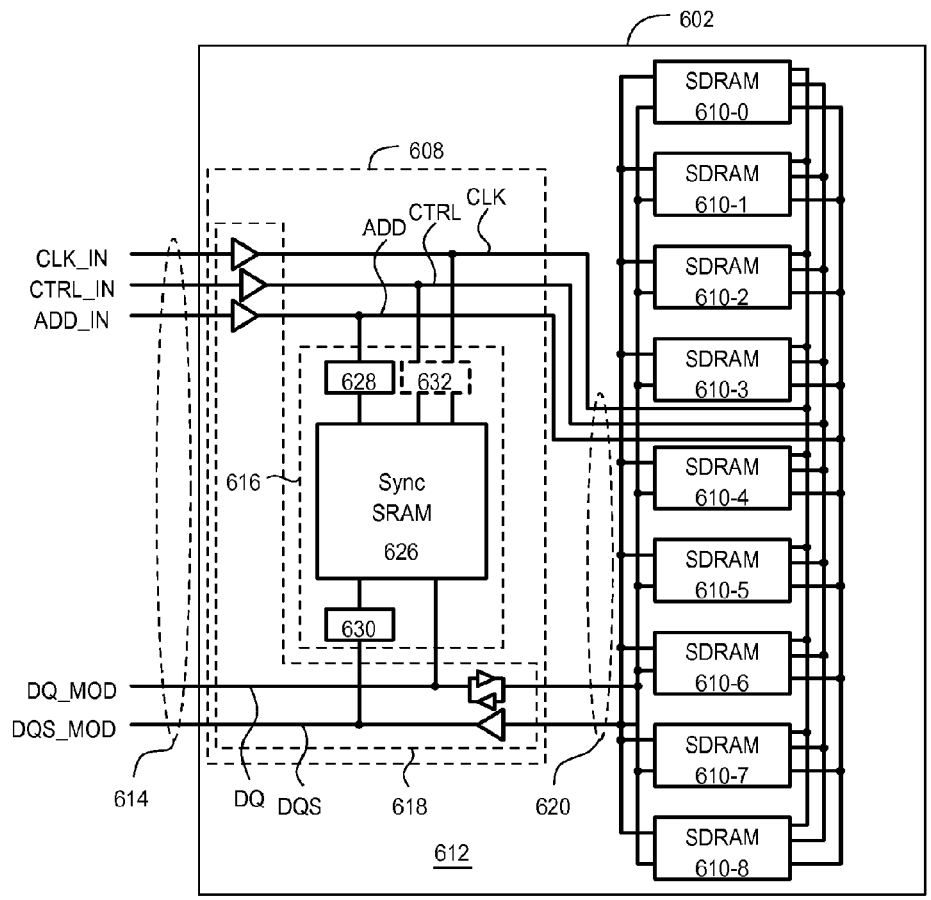
FIG. 6 is a block schematic diagram of a chunk buffer module according to a further embodiment.

Referring now to FIG. 6, a chunk buffer memory module according to a particular embodiment is shown in a block schematic diagram and designated by the general reference character 602. Chunk buffer module 602 may be one particular example of that shown as 202 in FIG. 2.

Standard speed memory IC devices 610-0 to -8 may be double data rate (DDR) type synchronous DRAMs (SDRAMs), each of which may be connected to a module bus 620. A module bus 620 may include clock signal lines CLK, control signal lines (CTRL), address signal lines (ADD), bi-directional data lines (DQ), and data strobe lines (DQS). SDRAMs (610-0 to -8) may have interfaces compatible with module bus 620. SDRAMs may include DRAM type memory cells that are periodically refreshed, and may process addresses in a multiplexed fashion, receiving row addresses followed by column addresses on a same set of address inputs. In addition, each SDRAM (610-0 to -8) may be connected to only a portion of data lines DQ. As but one possible example, data lines DQ may be 72-bits wide, and each of SDRAMs (610-0 to -8) may be connected to a different 8-bits of such a 72-bit bus.

A buffer section 608 may include a module interface 614, a high speed memory section 616, and a signal generator circuit 618. A module interface 614 may correspond to interfaces of SDRAMs (610-0 to -8), and so may include module connections CLK_IN, CTRL_IN, ADD_IN, DQ_MOD and DQS_MOD corresponding to DQ, CTRL, ADD, DQ and DQS, respectively. Further, a signal generator circuit 618 may be buffer circuits that may repeat signals between module bus 620 and module interface 614, and thus isolate module bus 620 from module interface 614 in terms of loading.

In FIG. 6, a high speed memory section 616 may include one or more DDR synchronous SRAMs (sync SRAMs) 626, an address processing circuit 628, a data strobe generation circuit 630, an optionally, a control/clock conversion circuit 632. Sync SRAMs 626 may include SRAM type memory cells that store data in a static fashion (e.g., are not periodically refreshed). In the embodiment shown, sync SRAMs 626 may process address values in parallel (e.g., address is not multiplexed), and may be connected to only a portion of data lines DQ, but at a wider data width than SDRAMs. As but one possible example, data lines DQ may be 72-bits wide, and there may be four sync SRAMs that are each connected to a different 18-bits of such 72-bits.

Address processing circuit 628 may receive address values received on module interface address inputs ADD_IN, and process such values to generate applied address values to sync SRAMs 626. In one embodiment, such processing may include generating one address from two address values (e.g., converting a row/column multiplexed address into a single applied address). In some embodiments, such processing may also include manipulation of address values, including offsetting a received address, or other address translation operations. A data strobe generation circuit 630 may generate a data strobe signal suitable for module interface 614. In one embodiment, such a circuit may manipulate a phase of clock signal CLK_IN to generate one or more data strobe signals. Optional control/clock conversion circuit 632 may convert DRAM compatible control signals into sync SRAM compatible control signals, in the event such command formats are different. In addition, control/clock conversion circuit 632 may alter clock signals CLK of module bus to provide input clock signals to sync SRAMs 626, as needed.

In this way, a memory module may include sync SRAMs and SDRAMs, with sync SRAMs buffering a chunk of the total address space of the memory module.

Figure 7:
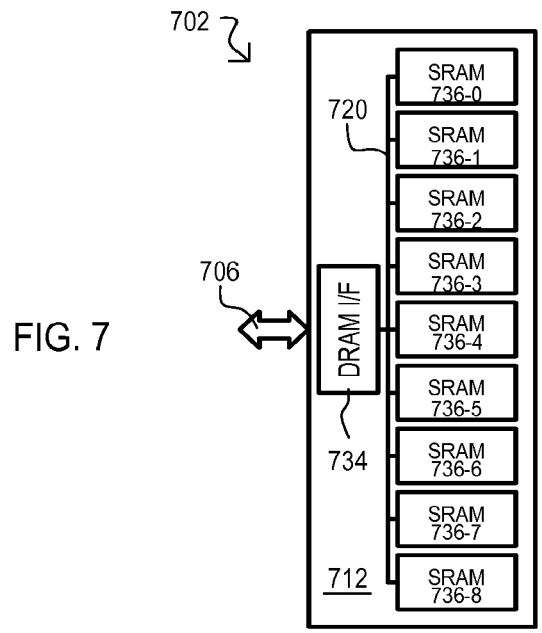
FIG. 7 is a block schematic diagram of a rapid channel module according to an embodiment.

Referring to FIG. 7, a rapid channel memory module according to another embodiment is shown in a block schematic diagram and designated by the general reference character 702. Memory module 702 may include an interface circuit 734 and a number of high-speed memory IC devices 736-0 to -8 formed on a module circuit board 712. In one particular embodiment, a memory module 702 may be one example of any of those shown as 102-00 to -31 in FIG. 1.

High speed memory IC devices 736-0 to -8 may provide access to data storage locations at a speed faster than other modules in a system. In the embodiment shown, high speed memory IC devices (736-0 to -8) may be commonly connected to a module bus 720. A module bus 720 may include address, command and data signal lines compatible with high speed memory IC devices (736-0 to -8).

In one embodiment, an interface circuit 734 may receive signals that are not compatible with high speed memory IC devices (736-0 to -8), and convert such signals for application to high speed memory IC devices (736-0 to -8). In a very particular embodiment, high speed memory IC devices 736-0 to -8 may be SRAM ICs. Such SRAM ICs may have faster access speeds than the DRAM ICs, which may serve as storage devices on other modules of a system.

In one embodiment, interface circuit 734 may be a particular DRAM interface. In a particular embodiment, such a DRAM interface may be a DDR SDRAM type interface.

In this way, a memory module may include a number of memory IC devices having high speed access.

Figure 8:
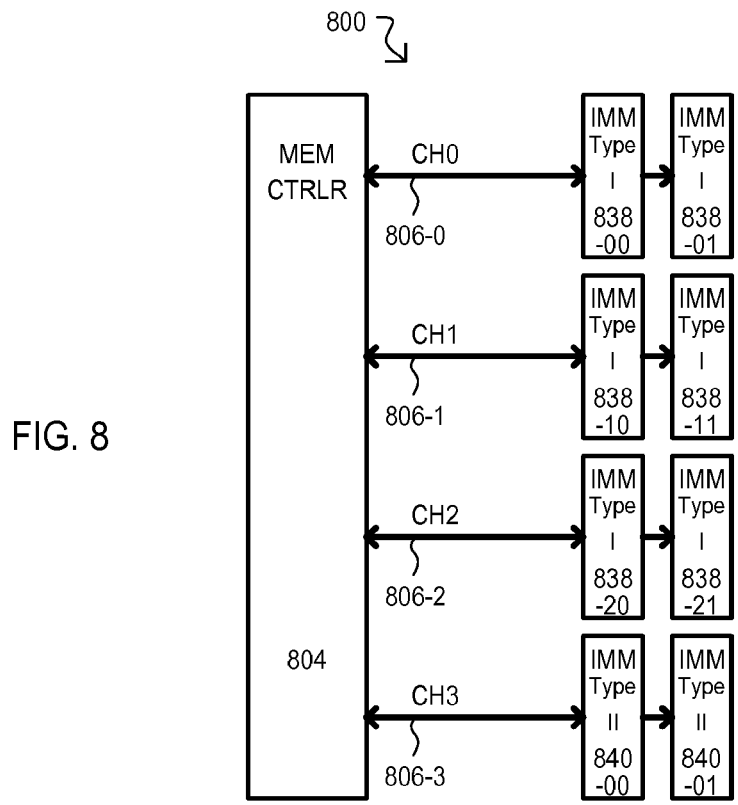
FIG. 8 is a block schematic diagram of a system according to an embodiment that includes rapid channel modules.

Referring to FIG. 8, a system according to another embodiment is shown in a block schematic diagram and designated by the general reference character 800. A system 800 may include both standard speed memory modules 838-00 to -21 as well as rapid channel memory modules 840-00 to -01, each having storage locations accessible by signals from a memory controller 804.

In the embodiment shown, standard speed memory modules (838-00 to -21) may provide accesses to storage locations at a standard speed, while rapid channel memory modules 840-00 to -01 may provide accesses to storage location at a speed faster than that of standard speed memory modules (838-00 to -21).

In FIG. 8, a memory controller 804 may access memory modules (838-00 to 838-21, 840-00/01) along a number of channels CH0-3 (806-0 to 806-3). Channels CH0 to CH2 may be connected to standard speed memory modules 838-00/01, -10/11, -20/21, respectively. Consequently, such channels (CH0-CH2) may be standard speed channels. In contrast, channel CH3 may be connected to high speed memory modules 840-00/01, such as that shown in FIG. 7. Thus, channel CH3 may be considered a rapid channel. In such an arrangement, a memory controller 804 may prioritize accesses, having fast accesses available along channel CH3.

In this way, a system may include different speed memory modules on different channels.

Figure 9:
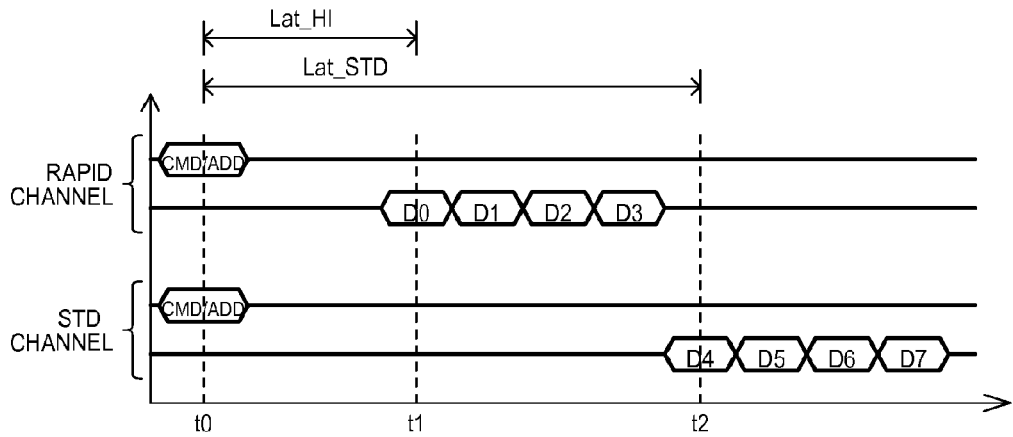
FIG. 9 is a timing diagram showing examples of accesses that may occur in a system having a rapid channel module according to an embodiment.

Referring to FIG. 9, a timing diagram shows an access operation according to an embodiment. FIG. 9 shows accesses that may occur over different speed channels. Accesses shown by FIG. 9 may be particular examples of memory accesses of a system like that shown as 800 in FIG. 8. The timing diagram of FIG. 9 shows waveforms for a rapid channel RAPID CHANNEL (e.g., CH3 of FIG. 8), as well as waveforms for a standard channel STD CHANNEL (e.g., CH0-2 of FIG. 8).

Referring still to FIG. 9, at about time t0, a memory module may receive a command (e.g., read or write) and all, or a portion of, an address within the address space of a memory module.

As shown, on a rapid speed channel, a data access may begin at about time t1 after a delay of about Lat_HI. In contrast, on a standard speed channel, a data access may begin at about time t2 after a delay of about Lat_STD.

In this way, accesses may be made by a memory controller at different speeds on different channels.

Figure 10:
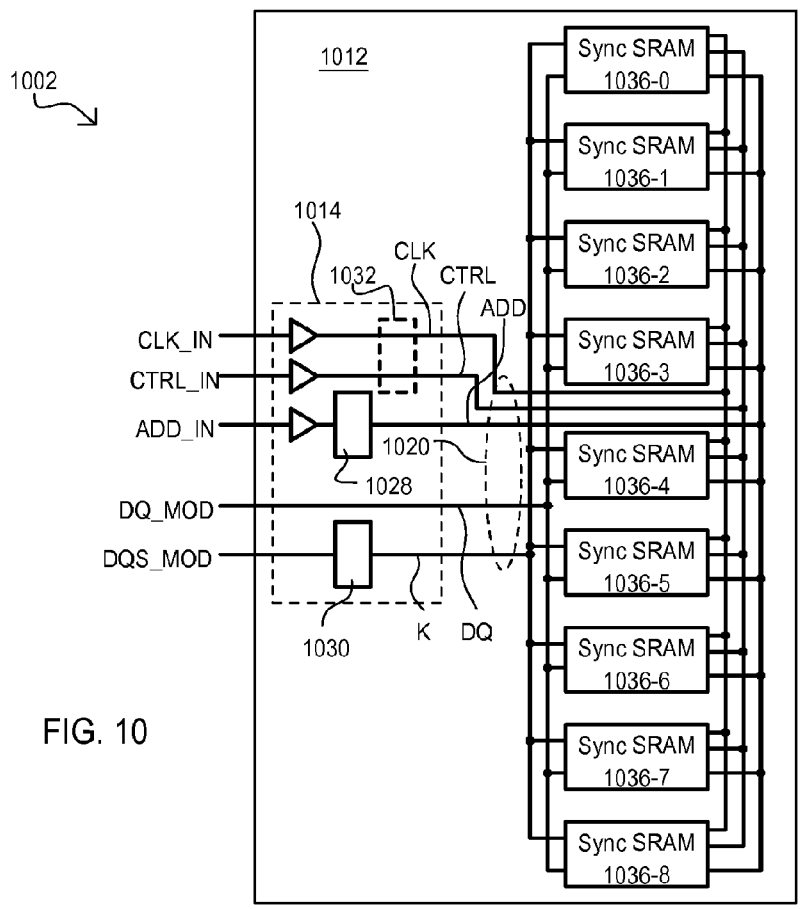
FIG. 10 is a block schematic diagram of a rapid channel module according to another embodiment.

Referring now to FIG. 10, a rapid channel memory module according to a particular embodiment is shown in a block schematic diagram and designated by the general reference character 1002. Rapid channel memory module 1002 may be one particular example of that shown in FIG. 7, and thus include a module interface 1014 and high speed memory IC devices 1036-0 to -8.

High speed memory IC devices (1036-0 to -8) may be DDR type sync SRAMs, each of which may be connected to a module bus 1020. A module bus 1020 may include clock signal lines CLK, control signal lines (CTRL), address signal lines (ADD), bi-directional data lines (DQ), and data clock lines (K). In the embodiment shown, sync SRAMs (1036-0 to -8) may have interfaces that are not compatible with a module interface. Sync SRAMs may include SRAM type memory cells that are not are periodically refreshed. In addition, each sync SRAM (1036-0 to -8) may be connected to only a portion of data lines DQ. As but one possible example, data lines DQ may be 72-bits wide, and each of SDRAMs (1010-0 to -8) may be connected to a different 8-bits of such 72-bits.

A module interface 1014 may provide an interface for rapid channel memory module 1002 that corresponds to interfaces of SDRAMs, and in the embodiment shown, may include module connections CLK_IN, CTRLIN, ADD_IN, DQ_MOD and DQS_MOD. In FIG. 10, a module interface 1014 includes an address processing circuit 1028, a data strobe generation circuit 1030, an optionally a control/clock conversion circuit 1032. Such circuits may operate as described for items 628, 630 and 632 of FIG. 6, respectively. That is, such circuits may convert SDRAM control signals and data formats, to signals and formats compatible with sync SRAMs.

In this way, a memory module may include an SDRAM interface, but store data with sync SRAMs.

Referring to FIG. 11, a stacked cache device memory module according to a further embodiment is shown in a block schematic diagram and designated by the general reference character 1102. Memory module 1102 may include a number of stacked cache memory IC packages 1142-0 to -8 connected to a module interface 1144 by a module bus 1120. In one particular embodiment, a memory module 1102 may be one example of any of those shown as 102-00 to -31 in FIG. 1.

Each stacked cache memory IC package 1142-0 to -8 may include one or more cache memory ICs and one or more standard speed memory ICs. A cache memory IC may cache a portion of an address space stored by its corresponding standard speed memory ICs. Accesses to addresses cached by a cache memory IC are faster than accesses to corresponding standard speed memory ICs.

In this way, a memory module may include a number of memory IC packages that each includes one or more cache memory ICs and standard speed memory ICs.

Referring to FIG. 12, a stacked cache memory IC package according to one embodiment is shown in a block schematic diagram and designated by the general reference character 1242. A package 1242 may include a package cache device 1246 and standard memory ICs 1248-0 to -3. While FIG. 12 shows one package cache device and four standard memory ICs, the number of devices may vary in other embodiments.

A package cache device 1246 may include a cache memory 1250, a cache controller circuit 1252, a package interface 1254, controller interface 1256, and memory control connections 1258. A cache memory 1250 may include storage circuits for caching data from standard memory ICs (1248-0 to -3). Thus, a cache memory 1250 may be accessed in place of an access to standard memory ICs (1248-0 to -3).

A cache controller circuit 1252 may detect cache "hits", and in response, control access to cache memory 1250. A cache hit may occur when access is requested for data stored in cache memory 1250 that was previously retrieved from standard memory ICs (1248-0 to -3). A cache memory 1250 may be based on a memory technology that provides faster access than standard memory ICs (1248-0 to -3). In a very particular embodiment, cache memory 1250 may be based on SRAM cells, and standard memory ICs (1248-0 to -3) may include DRAM cells to store data.

A controller interface (I/F) 1256 may receive address and command signals received on package interface 1254 (some shown as ADD/CTRL) and provide such values for cache controller circuit 1252. In the particular embodiment shown, a controller I/F 1256 may also receive externally generated input data values, and output data values on controller connections (shown as data input/output connections (DQ)).

Memory control connections 1258 may provide signals for accessing standard memory ICs (1248-0 to -3) within stacked cache memory IC package 1242. In the very particular embodiment of FIG. 12, memory control connections 1258 include output connections for address and control signals ADD/CTRL', which may correspond to input signals ADD/CTRL at package connections 1254. In addition, memory control connections 1258 may include data I/Os DQ'. A stacked cache memory IC package 1242 may be a single integrated circuit package containing multiple dice, electrically interconnected to one another.

Referring still to FIG. 12, a cache hit read operation according to an embodiment is shown. Address and control signals ADD/CTRL (shown by bold lines) may be received. It is assumed that an address corresponds to data already cached within cache memory 1250 resulting in a cache "hit". That is, while data to be read is stored in one or more standard speed memory ICs (1248-0 to 1248-3), the same data has been previously cached within cache memory 1250. In response to the cache hit, cached data values (shown by bold lines) may be output on package connections 1254, in lieu of outputting data from standard speed memory ICs (1248-0 to 1248-3). Data locations may be accessed from a cache memory 1250 at substantially faster speeds than locations within standard speed memory ICs (1248-0 to 1248-3).

Referring to FIG. 12A, a stacked cache memory IC package according to a particular embodiment is shown in side cross sectional view and designated by the general reference character 1242'. A package 1242' may include standard speed memory ICs 1248-0'/1' arranged horizontally with a package cache device 1246'. Access to such devices within package 1242' may be by way of package connections 1254'. A package 1242' may be one implementation of that shown in FIG. 12.

Referring to FIG. 12B, a stacked cache memory IC package according to another particular embodiment is shown in side cross sectional view and designated by the general reference character 1242". A package 1242" may include standard speed memory devices 1248-0"/1" arranged vertically a package cache device 1246". Access to such devices within package 1242' may be by way of package connections 1254'. A package 1242" may be one implementation of that shown in FIG. 12.

In this way, a stacked cache memory IC package may include one or more package cache devices along with one or more standard speed memory ICs. Accesses to data cached data may be faster than non-cached data.

Figure 13:
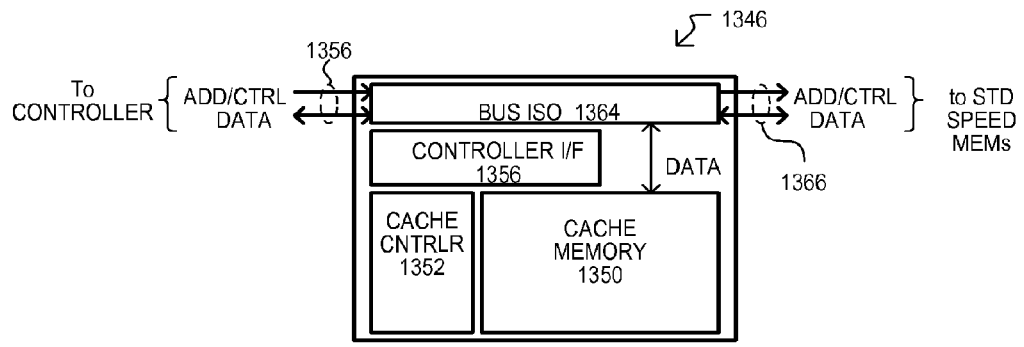
FIG. 13 is a block schematic diagram of a cache device according to an embodiment.

Referring to FIG. 13, a package cache device 1346 according to one embodiment is shown in a block schematic diagram. A package cache device 1346 may be one example of that shown as 1246, 1246' or 1246" in any of FIG. 12, 12A or 12B. The package cache device 1346 may be one particular example of a "look-side" type cache device.

A package cache device 1346 may include a cache memory 1350, a cache controller circuit 1352, a cache controller interface (I/F) 1356, and a bus isolation circuit 1364. A cache memory 1350 may have storage locations that cache data for other memory locations. A cache memory 1350 may be controlled by a cache controller circuit 1352 to store data and/or output data. A cache controller circuit 1352 may receive control signals from a cache controller I/F 1356, and in response, enable access to cache memory 1350. Such accesses may have a predetermined timing relationship with respect to received control signals. For example, in response to a control signals, data may be output or written into cache memory a predetermined time period (e.g., clock cycles) afterward.

A bus isolation circuit 1364 may control how signals are transmitted between package interface 1356 and standard speed memory ICs (not shown) within the same package. In a particular embodiment, a bus isolation circuit 1364 may receive control signals and input data signals without including the load of standard speed memory ICs attached to memory control connections 1366. For non-cache accesses, input signals received on controller interface 1356 may be repeated on memory control connections 1366, and similarly, output signals on memory control connections 1366 may be output on controller interface 1356.

In this way, a package cache device may be a look-aside cache device having a bus isolation circuit for selectively isolating signals received from a memory controller from signals output to control memory circuits.

Figure 14:
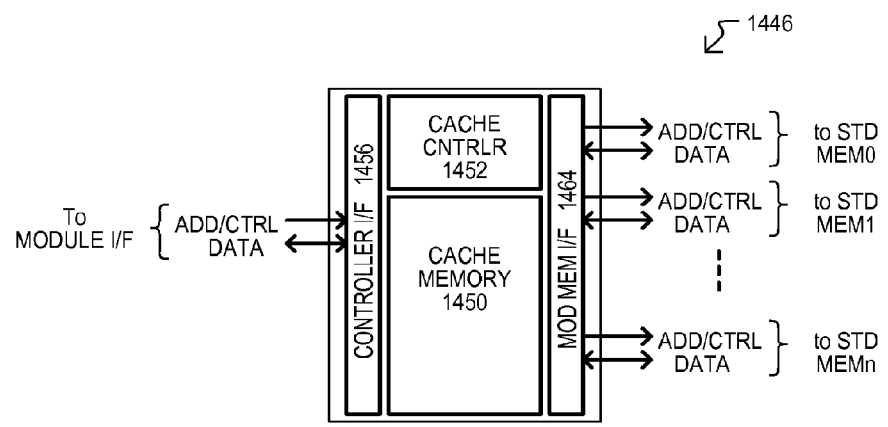
FIG. 14 is a block schematic diagram of a cache device according to another embodiment.

Referring to FIG. 14, a package cache device 1446 according to another embodiment is shown in a block schematic diagram. A package cache device 1446 may be one example of that shown as 1246, 1246' or 1246" in any of FIG. 12, 12A or 12B. The package cache device 1446 may be one particular example of a "look-through" type cache device.

Referring to FIG. 14, a package cache device 1446 may include a cache memory 1450, a cache controller circuit 1452, a cache controller UF 1456, and a standard speed memory interface 1464. In such a look-through architecture, signals received by controller interface 1456 may be decoded, and new control signals and/or data signals may be generated at standard speed memory interface 1464.

In this way, a package cache memory device may have a look-through architecture.

Referring still to FIG. 14, in still other embodiments a look through cache like that of FIG. 14 may be substituted for, or included as part of a high speed memory section 216. A cache controller 1452 may control interfaces 1456 and 1464 to provide dynamic frequency and/or voltage scaling. As but one example, accesses to a cache memory 1450 may occur at one frequency and/or according to one latency, while accesses through a cache 1446 to standard speed memory devices (e.g., 210-0 to 210-8) may occur at another frequency and/or according to another latency.

Figure 15A:
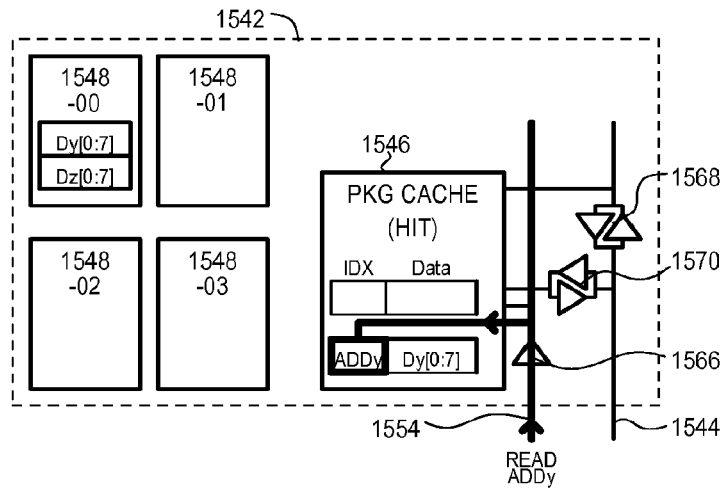
FIGS. 15A to 15C are block schematic diagrams showing pre-fetch on hit operations that may occur in a stacked cache memory package according to an embodiment.
Figure 15B:
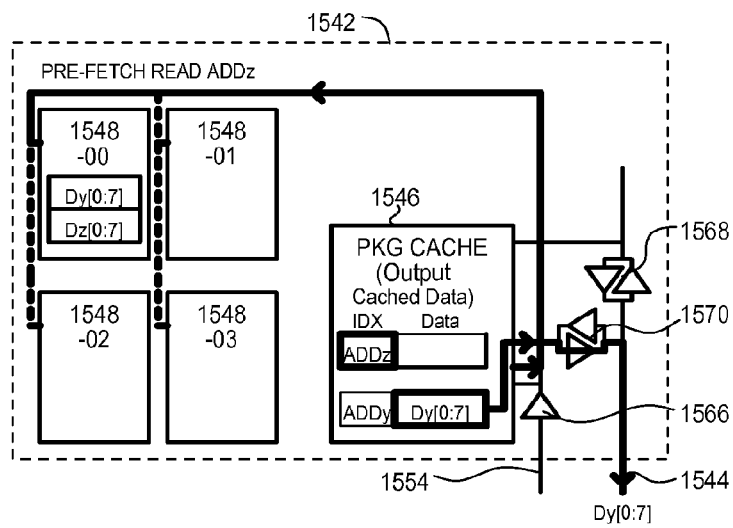
Figure 15C:
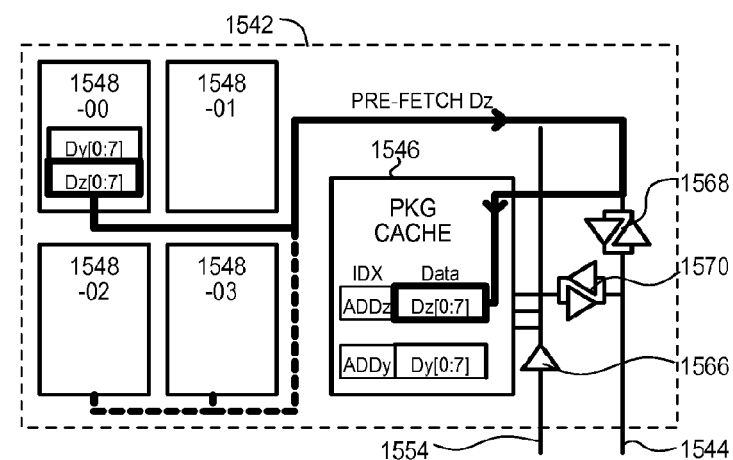

Referring now to FIGS. 15A to 15C, operations of a stacked cache memory IC package according to an embodiment are shown in a series of block diagrams. The stacked cache memory IC may be one example of any of those shown as 1142-0 to -8 in FIG. 11. FIGS. 15A to 15C show one example of a "pre-fetch on hit" type of operation. In such an operation, in the event of a read cache hit (e.g., read operation to data already cached in a package cache device), cached read data may be output, and in addition, data from a different location is cached (i.e., is "pre-fetched"). Pre-fetching data in this fashion may increase the probability of another cache hit in a subsequent memory access.

A stacked cache memory IC package 1542 may include a package cache device 1546 and a number of standard speed memory ICs 1548-00 to 1548-03. In the particular embodiments of FIGS. 15A to 15C, a package cache device 1546 may have a particular look-aside architecture, however, alternate pre-fetch embodiments may include a package cache device having a different look aside architecture, or alternatively, having a look through architecture, like that shown in FIG. 14.

Referring still to FIGS. 15A to 15C, in the embodiments shown it is assumed that standard speed memory ICs (1548-00 to 1548-03) store first data "Dy" and second data "Dz" at separate addressable locations. It is also assumed that data values Dy and Dz have a predetermined relationship conducive to pre-fetching. That is, if data Dy is accessed, it is likely that data Dz will be accessed. In some embodiments, such a relationship may be simply an adjacent address, but in other embodiments, may be more complex, based on address range values, or some arithmetic/logic operation. It is also assumed that data Dy has been cached within package cache device 1542 by a previous operation.

Referring now to FIG. 15A, a stacked cache memory IC package 1542 may receive address and control values (shown by a bold line) that indicate a read request for data Dy at address ADDy (READ ADDy). Isolation buffer 1566 may forward such a request for processing by circuits of package cache device 1546. Optionally, such data may be forwarded to standard speed memory ICs (1548-00 to 1548-03). In such a case, resulting read data from standard speed memory ICs (1548-00 to 1548-03) may be prevented from being output by placing isolation circuit 1568 into a high impedance state, or by disabling standard speed memory ICs (1548-0 to 1548-18) with control signals (e.g., clock enable signals (CKE)) generated by package cache device 1546. Package cache device 1546 may compare the received address to cached addresses. Because data value Dy is already stored, package cache device 1546 may detect a read cache hit.

Referring to FIG. 15B, in response to the read cache hit, package cache device 1542 may enable isolation buffer 1570 and output cached data (Dy[0:7]). In addition, package cache device 1542 may generate a pre-fetch address and corresponding read control signals to pre-fetch data Dz (PRE-FETCH READ ADDz). Such address/control values may be output to standard speed memory ICs 1548-00 to 1548-03.

Referring to FIG. 15C, in response to the pre-fetch address and control signals (PRE-FETCH READ ADDz), standard speed memory ICs 1548-00 to 1548-03 may output pre-fetched data (PRE-FETCH DATAz) which may be received by package cache device 1546 and stored as newly cached data. In the particular embodiment shown, package cache device 1546 may place isolation buffer circuits 1570 and 1568 into high impedance states as such cached data is stored.

In this way, a memory device may pre-fetch stored data in response to a cache hit to increase the possibility of another cache hit in a subsequent operation.

Figure 16A:
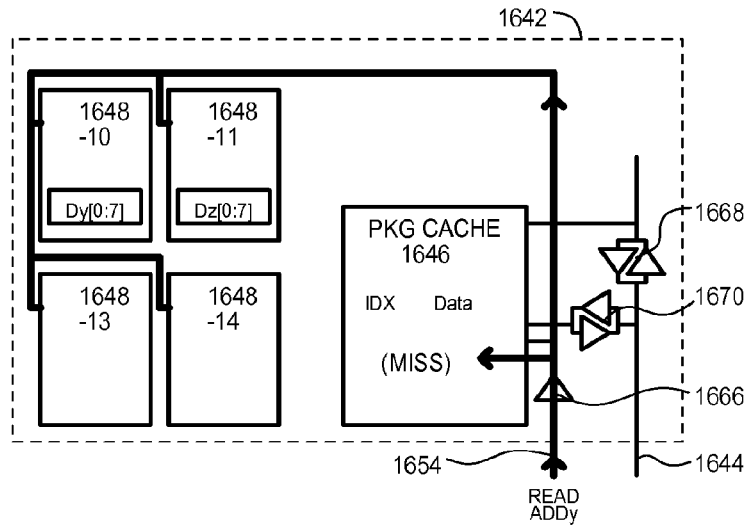
FIGS. 16A to 16C are block schematic diagrams showing pre-fetch on miss operations that may occur in a stacked cache memory package according to an embodiment.
Figure 16B:
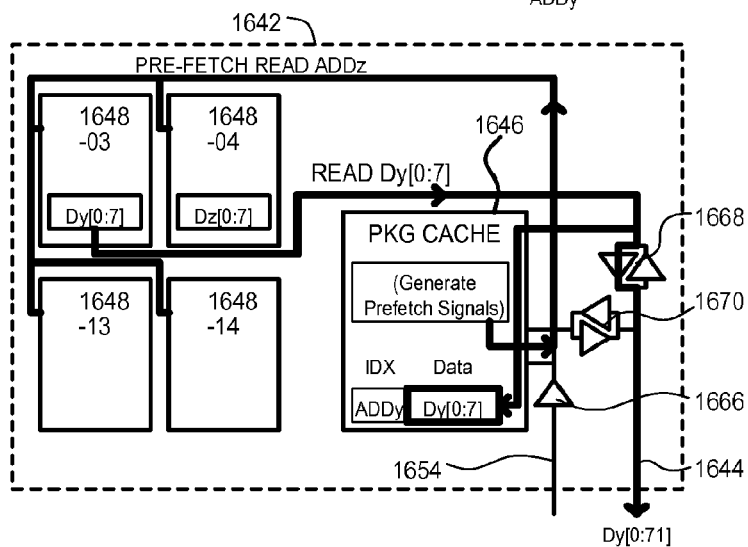
Figure 16C:
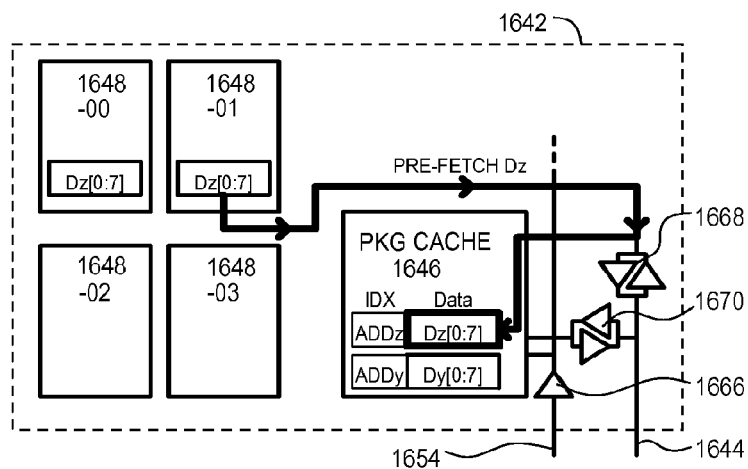

Referring now to FIGS. 16A to 16C, operations of a stacked cache memory IC package 1642 according to another embodiment are shown in a series of block diagrams. The stacked cache memory IC may be one example of any of those shown as 1142-0 to -8 in FIG. 11. FIGS. 16A to 16C show one example of a "pre-fetch on miss" type of operation. In such an operation, in the event of a read cache miss (e.g., read operation to data not already cached in a module cache device), read data may be output and cached from standard speed devices, and in addition, data from a different location is cached (i.e., is "pre-fetched"). Pre-fetching data in this fashion may increase the probability of another cache hit in a subsequent memory access. A stacked cache memory IC package 1642 may include some of the same sections as FIGS. 15A to 15C, accordingly, like sections are referred to with the same reference character but with the first digits being a "16" instead of "15".

In the embodiments of FIGS. 16A to 16C, it is assumed that first data "Dy" is stored within standard speed memory circuits 1648-0 to -03. Further, as in the case of FIGS. 15A to 15C, data Dz is good pre-fetch candidate with respect to data Dy. It is also assumed that neither data Dy nor data Dz has been cached within package cache device 1646.

Referring to FIG. 16A, a stacked cache memory IC package 1642 may receive address and control values (READ ADDy) that indicate a read request for data Dy at address ADDy. Further, such address and control signals are provided to package cache device 1646 by isolation buffer 1666. However, unlike the embodiments of FIGS. 15A to 15C, a comparison by package cache device 1646 indicates a cache miss. In response to such a read cache miss, or regardless of such a miss, address and control signals (READ ADDy) may be applied to standard speed memory ICs (1648-0 to -3).

Referring to FIG. 16B, in response to read address and control data, data READ Dy may be output from standard speed memory ICs (1648-00 to 1648-03). Such read data (Dy[0:7]) may be output by isolation circuit 1668. In addition, such read data (Dy[0:7]) may also be cached within package cache device 1646. In response to the cache miss, a package cache device 1646 may generate pre-fetch signals (PRE-FETCH READ ADDz) for pre-fetching data Dz within standard speed memory ICs (1648-0 to -3). It is noted that such pre-fetch signals may be generated prior to, coincident with, or after the output read data Dy[0:7].

Referring to FIG. 16C, in response to the pre-fetch address and control signals (PRE-FETCH READ ADDz), pre-fetched data 958 (PRE-FETCH Dz) may be output from standard speed memory ICs (1648-0 to -3). In the particular embodiment shown, package cache device 1646 may place isolation buffer circuits 1670 and 1668 into high impedance states, and store the cached data (Dz[0:7]).

In one embodiment, a package cache device 1646 may be a dual port device that may allow data to be received concurrently at two different data ports. In such an arrangement, read data (e.g., Dy[0:7]) may be output and cached at the same time pre-fetch data (e.g., Dz[0:7]) is cached.

In this way, a package cache device may pre-fetch data stored in standard speed memory ICs of a same package in response to a cache miss. Such an action may increase the possibility of another cache hit in a subsequent access operation.

Figure 17:
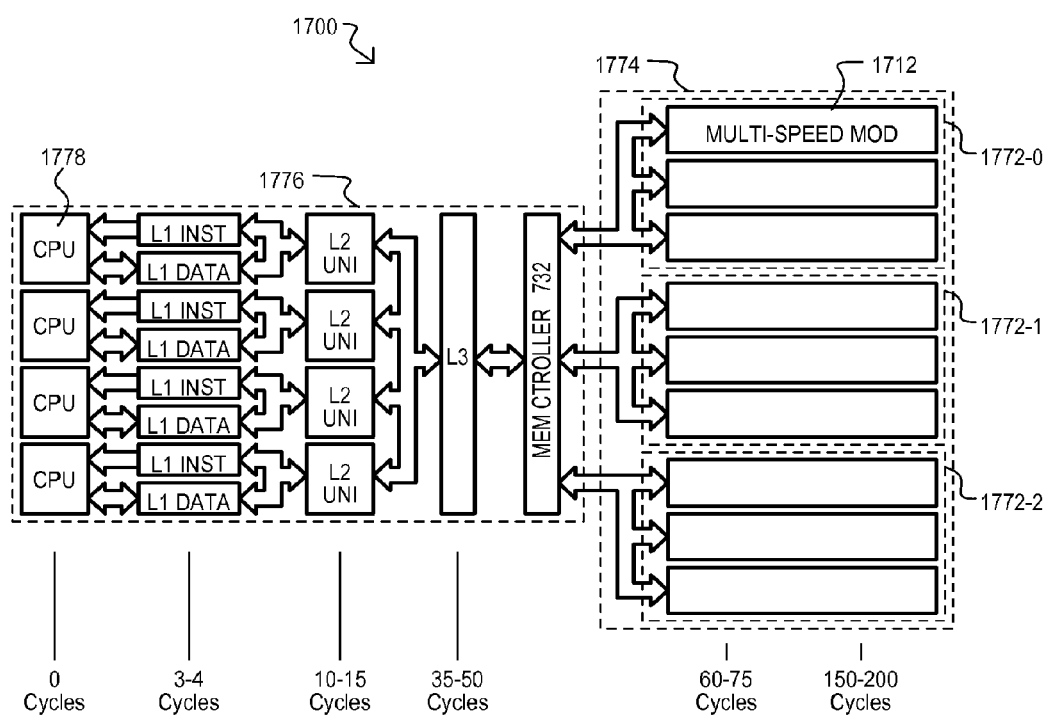
FIG. 17 is a block schematic diagram of a system according to another embodiment.

Referring to FIG. 17, a system according to another embodiment is shown in a block schematic diagram and designated by the general reference character 1700. A system memory 1700 may be a computing system that includes a number of circuit board groups 1772-0 to 1772-2, each connected to a processing package 1776. Each circuit board group 1772-0 to 1772-2 may include a number of circuit boards (one shown as 1712). Each circuit board (e.g., 1712) may include storage locations accessible by variable access speeds according to embodiments shown herein, or equivalents.

A system 1700 may be one implementation of that shown as 100 in FIG. 1.

Circuit board groups 1772-0 to 1772-2 may collectively form a system memory 1774. Such a system memory 1774 may be increased in capacity by adding more circuit boards (e.g., 1712) or decreased in size by removing such circuit boards.

A processing package 1776 may access memory on circuit boards (e.g., 1712) with read and/or write operations. In response to such operations, circuit boards (e.g., 1712) may provide variable access speeds. That is, such circuit boards may services some requests at a faster speed (e.g., lower latency) than other requests. The very particular processing package 1776 of FIG. 17 may be a multi-processor system including multiple central processing units (CPUs) (one shown as 1778), and three layers of "on-board" cache (shown as L1, L2 and L3). An on-board cache may be formed in a same substrate as an integrated circuit including a CPU and/or may be a memory integrated circuit included within a multichip module containing one or more CPUs.

Layer 1 cache (L1) may include both instruction and data caches, accessible by a corresponding CPU. Layer 2 cache (L2) may be a data cache also accessible by a corresponding CPU. Layer 3 (L3) cache may be a shared data cache accessible by any of the CPUs. It is noted that on-board caches L1, L2 and L3 do not scale with changes in the size of system memory 1774.

In sharp contrast, an amount of high speed memory may scale with a size of system memory 1774. For example, if a system memory 1774 includes chunk buffered modules, like that shown in FIG. 2, increasing the number of such modules in a system memory 1774 increases the amount of total memory space buffered by high speed access devices. Further, if a system memory 1774 includes a rapid channel module, like that shown in FIG. 7, increasing the number of such modules in a system memory 1774 increases the amount of memory on a rapid channel. Still further, if a system memory 1774 includes stacked cache device memory modules, like that shown in FIG. 11, increasing the number of such modules in a system memory 1774 increases the amount of memory cached, and therefore the amount of data available at a lower latency.

Referring still to FIG. 17, exemplary access speeds, noted in CPU clock cycle time units are shown. Accesses to layer 1 cache (L1) may occur within 3-4 clock cycles. Access to layer 2 cache (L2) may occur within 10-15 clock cycles. Accesses to shared layer 3 cache (L3) may occur in 35-50 clock cycles. Slower speed accesses may take from 150-200 clock cycles. However, faster speed accesses (e.g., accesses to buffered memory, rapid channel modules, or locations cached on modules) may be 60-75 clock cycles, improving performance over a system memory that includes only standard speed devices (e.g., system memory of conventional DIMMs).

In this way, a system may have a system memory with fast access locations that scale with the size of the system memory.

Figure 18A:
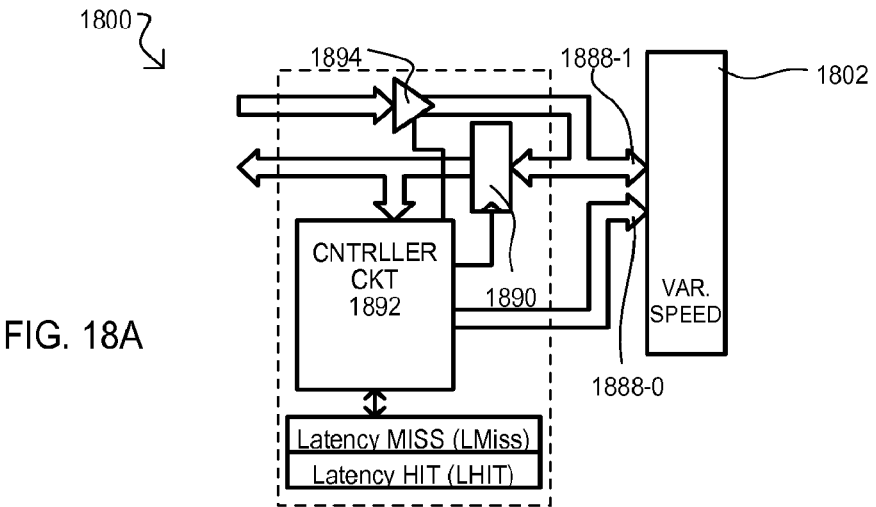
FIGS. 18A to 18C are block schematic diagrams of systems having memory controllers with variable speed access according to various embodiments.
Figure 18B:
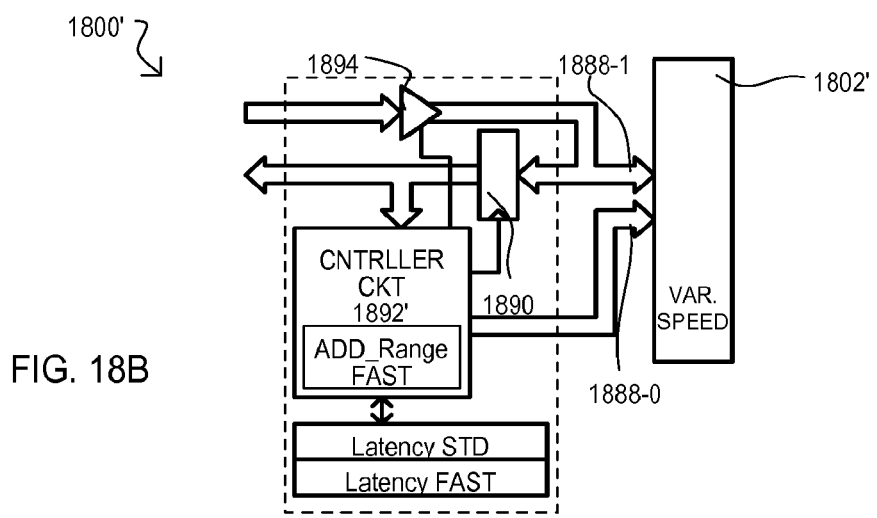
Figure 18C:
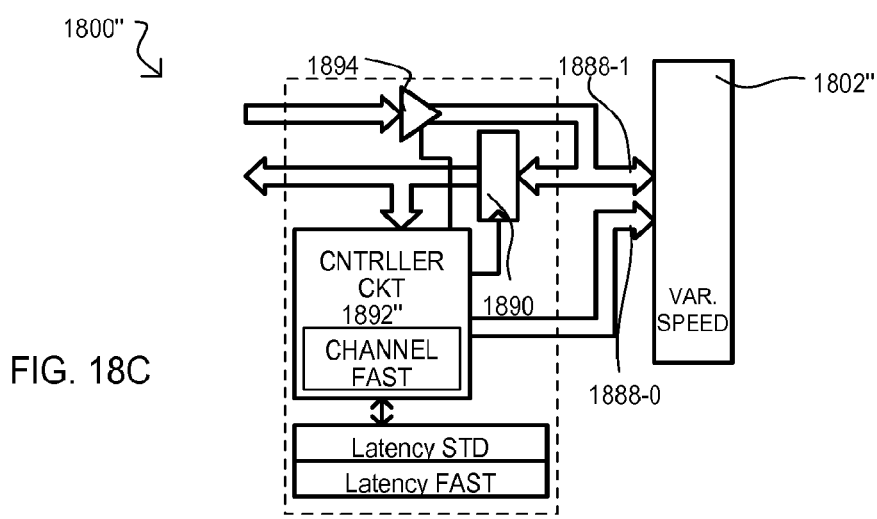

By including a variable speed modules as shown in the embodiments herein and equivalents, access times for a memory controller may vary. FIGS. 18A to 18C show various systems with memory controller that may accommodate variable accesses to a memory module.

Referring to FIG. 18A, a system according to an embodiment is shown in a block diagram and designated by the general reference character 1800. A system 1800 may include one or more memory modules (one shown as 1802) that may be connected to a memory controller 1804. In the embodiment shown, a memory module 1802 may be a stacked cache device module, like that shown in FIG. 11. A stacked cache device module 1802 may return a predetermined signal to a memory controller 1804 in the event of a cache hit.

A memory module 1802 may be attached to a memory controller 1804 by controller connections 1888-0 and 1888-1. Controller connections 1888-0 may provide control and address signals, and in one particular embodiment, may be one-way connections from memory controller 1804 to memory module 1802. In alternate embodiments, controller connections 1888-0 may include a bi-directional path and/or a one-way signal path from memory module 1802 to memory controller 1804 that may enable a cache indication to be sent to the memory controller 1804. Controller connections 1888-1 may provide data values, and in one embodiment may be bi-directional, allowing read data to be output to memory controller 1804 or write data to be input from memory controller 1804. In alternate embodiments, controller connections 1888-1 may include separate one-way signal paths for read and write data.

A memory controller 1804 may include a data input circuit 1890, a controller circuit 1892, and data driver circuits 1894. A data input circuit 1890 may allow data from memory module 1802 to flow through to controller circuit 1892. A data driver circuit 1894 may drive data for input to memory module 1802. A controller circuit 1892 may monitor a cache hit indication from memory module 1802, and in response, alter a latency at which read data is received (e.g., latched) and/or write data is driven by data driver circuit 1894. In the very particular embodiment of FIG. 18A, a memory controller 1804 may have storage locations for two or more latency values to enable controller circuit 1892 to alter operations based on detecting a cache hit or miss. FIG. 18 shows two particular values Latency MISS (LMiss) and Latency HIT (LHIT). However, such values may be "hard-wired" into a circuit or inherent in a circuit response.

In this way, a memory module may provide a cache hit indication to a memory controller. In addition or alternatively, a memory controller may respond with different latencies depending upon a cache hit indication from a memory module.

Referring to FIG. 18B, a system according to another embodiment is shown in a block diagram and designated by the general reference character 1800'. A system 1800' may include some sections like those of FIG. 18A. However, in FIG. 18B one or more memory modules (one shown as 1802') may include a chunk buffered module, like that shown in FIG. 2. A chunk buffered module 1802' may have a portion of an address space stored by high speed memory devices, while another portion of the address space is stored in standard speed memory devices.

A controller circuit 1892 may have range information (ADD_Range FAST) that identifies which addresses correspond to high speed memory devices. Such a range value may be programmable, or may be hard wired into the circuit. Further, a memory controller 1804 may have storage locations for two or more latency values to enable controller circuit 1892 to alter operations based on accesses within range ADD_Range FAST, versus accesses outside such a arrange. FIG. 18B shows two particular values Latency STD and Latency FAST. Such values may be hardwired into a circuit or inherent in a circuit response.

In this way, a memory controller may respond with different latencies depending upon the address accessed in an operation.

Referring to FIG. 18C, a system according to a further embodiment is shown in a block diagram and designated by the general reference character 1800". A system 1800" may include some sections like those of FIG. 18A. However, in FIG. 18C one or more memory modules (one shown as 1802") may include a rapid channel module, like that shown in FIG. 7. A rapid channel module 1802" may be formed of high speed memory devices, as opposed to other modules of the system.

A controller circuit 1892 may have channel information (CHANNEL FAST) that identifies which channels include rapid channel modules. Further, a memory controller 1804 may have storage locations for two or more latency values to enable controller circuit 1892 to alter operations based on accesses to different channels. FIG. 18C shows two particular values Latency STD and Latency FAST. Such values may be hardwired into a circuit or inherent in a circuit response.

In this way, a memory controller may respond with different latencies depending upon the channel accessed in an operation.

Figure 19:
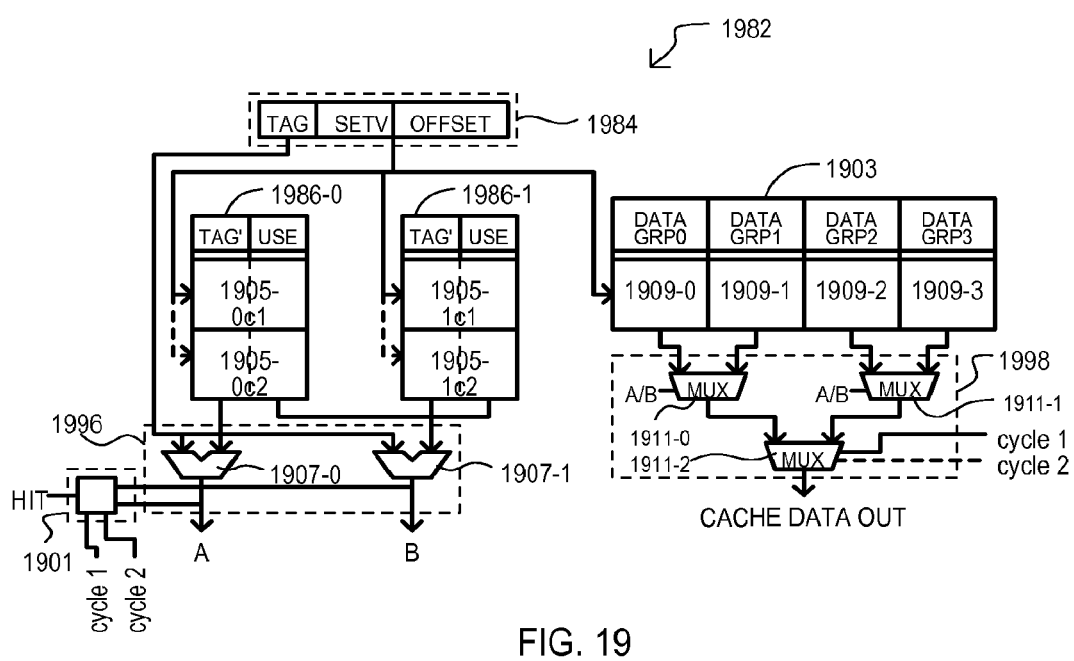
FIG. 19 is a block schematic diagram of a cache architecture according to an embodiment.

Referring now to FIG. 19, one example of a cache architecture that may be included in embodiments is shown in a block schematic diagram and designated by the general reference character 1982. A cache architecture 1982 may be included in a cache device. As but one example, a cache architecture may correspond to a package cache device, like that shown as 1246 in FIG. 12. However, such a cache architecture may be included in various other implementations, including but not limited to a separate IC on a memory module, or a separate IC between a memory controller and one or more memory modules.

A cache architecture 1982 may include a cache input 1984, tag blocks 1986-0/1, a compare section 1996, a data block 1903, a cache data output control 1998, and hit logic 1901. A cache input 1984 may receive values TAG, SETV and OFFSET in response to received address data. In one particular embodiment, there may be a one-to-one bit correspondence between address data and the fields TAG, SETV and OFFSET. In an alternate embodiment, address translation or some other operation may generate values TAG, SETV and OFFSET from a received address value.

While the embodiment of FIG. 19 shows two tag blocks (1986-0 and 1986-1), a number of tag blocks may be configurable. Each tag block (1986-0 and 1986-1) may include a number of entries accessible by values SETV and optionally value OFFSET, and according to a particular access cycle. Each entry within a tag block (1986-0 and 1986-1) may include a cached tag value TAG' and a USE value. A cached tag value TAG' may be used for comparison with an input TAG value. A USE value may indicate an entry's validity (is the entry used or available) and/or may indicate the last time an entry was used, or the number of times an entry has been used. Such a USE value can be used to dictate when a cache entry is to be freed up (i.e., evicted) for use by a new cache value. If a SETV value corresponds to an entry within a tag block (1986-0 to 1986-1) a corresponding tag value TAG' will be output to compare section 1996.

Values within tag blocks (1986-0 and 1986-1) may be logically arranged into sections accessed on different cycles. In the embodiment shown, tag block 1986-0 has been arranged to include section 1905-0$c1$ accessible on a first cycle, and section 1905-0$c2$ accessed on a subsequent cycle. Similarly, tag block 1986-1 has been arranged to include section 1905-1$c1$ accessible on the first cycle, and section 1905-1$c2$ accessed on a subsequent cycle. The number of sections within a tag block may be configurable. In a very particular embodiment, an input tag values TAG and cached tag values TAG' may be portions of a larger tag value. Accordingly, a valid cache hit may result when hits occur over multiple cycles.

Accordingly, a cache architecture 1982 may provide for configurable associativity. That is, a set value may be configurable for a different granularity in cache compare tries. A cache input 1984 may receive values TAG, SETV and OFFSET.

A compare section 1996 may compare a cached values TAG' to input value TAG to thereby determine if a hit has occurred in any tag block (1986-0/1). In the very particular example of FIG. 19, a compare section 1996 may include comparators 1907-0 and 1907-1, which may each compare an input tag value TAG to a cached tag value TAG' output from tag blocks 1986-0 to 1986-2 on a given cycle, to thereby generate a block hit indications A and B.

Cache hit logic 1901 may provide a HIT indication representing when a stored tag value TAG' matches an applied tag value. It is noted that if a "hit" occurs on one cycle, searches for subsequent cycles may be cancelled. This may save the amount of power consumed in cache match operations. In addition or alternatively, cache hit logic 1901 may logically combine block hit indications A and B according to clock cycles (cycle 1 and cycle 2), in the event each stored tag value TAG' is one portion of a larger value.

A data block 1903 may include a number of entries accessible by value SETV and, optionally, value OFFSET. A data block 1903 may be organized into groups corresponding to both tag blocks and access cycles. In the particular example of FIG. 19, data block 1903 may include group 1909-0, which may correspond to tag block 1986-0 and cycle 1, group 1909-1, which may correspond to tag block 1986-1 and cycle 1, group 1909-2, which may correspond to tag block 1986-0 and cycle 2, and group 1909-3, which may correspond to tag block 1986-1 and cycle 2.

A cache data output control 1998 may output cached data DATA from data block 1903 corresponding to a hit within a given tag block (1986-0 to 1986-1) and a given operational cycle. In the very particular embodiment of FIG. 19, a cache data output control 1998 may include data block MUXs 1911-0 and 1911-1 and cycle MUX 1911-2. Data block MUX 1911-0 may output a data value from either group 1909-0 or group 1909-1 in response to hit indications A and B generated by compare section 1996. Similarly, data block MUX 1911-1 may output a data value from either group 1909-2 or group 1909-3 in response to hit indications A and B generated by compare section 1996. Cycle MUX 1911-2 may output values from data block MUX 1911-0 or 1911-1 in response to signals cycle 1 and cycle 2.

In this way, memory devices may include cache architectures with configurable associativity.

Figure 20:
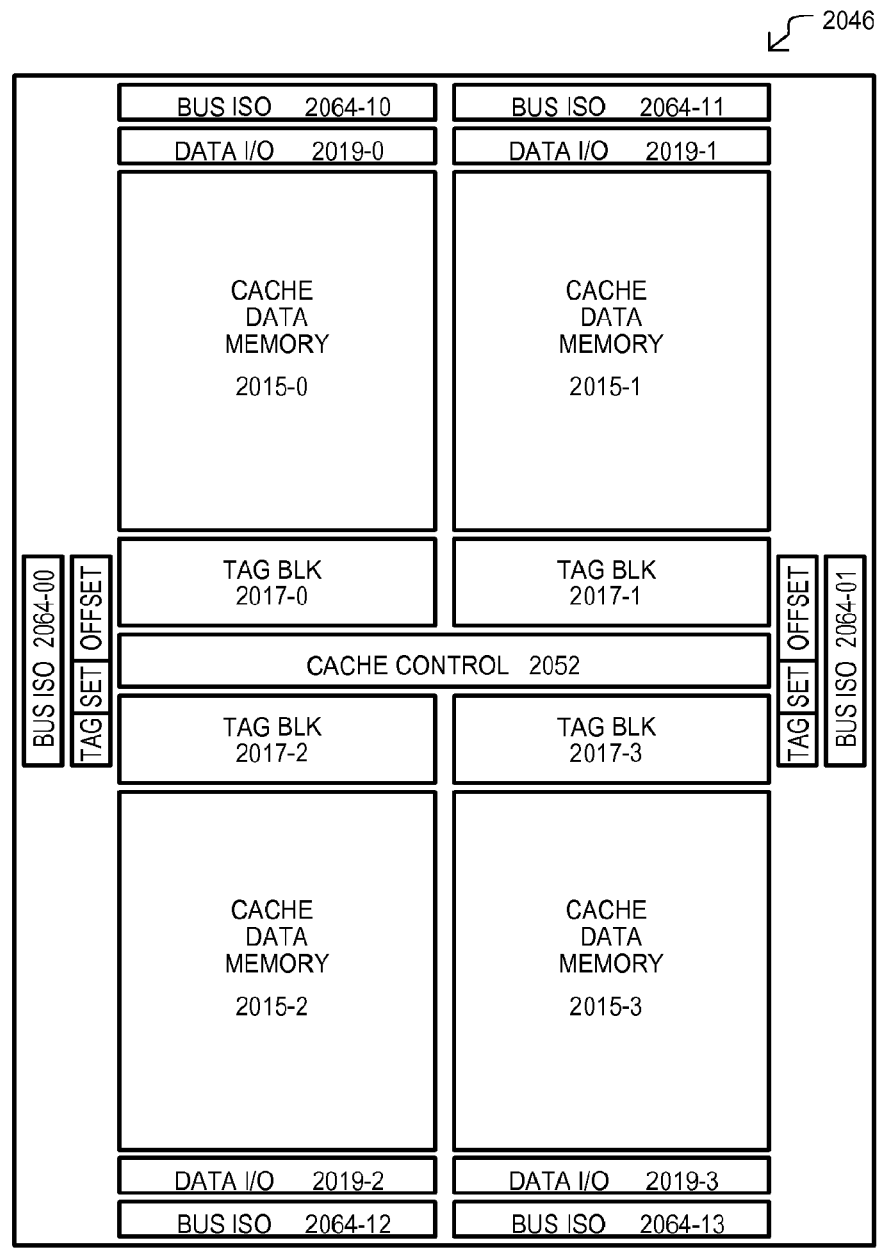
FIG. 20 is a top plan view of a cache device according to an embodiment.

Referring now to FIG. 20, a cache device according another embodiment is shown in a top plan view, and designated by the general reference character 2046. A cache device 2046 may be one particular example of a cache device having an architecture like that shown in FIG. 19.

A memory device 2046 may include cache data memory sections 2015-0 to 2015-3, tag blocks 2017-0 to 2017-3, cache controller 2052, bus isolation circuits 2064-00 to 2064-13, and data input/outputs (I/Os) 2019-0 to 2019-3.

Cache data memory sections 2015-0 to 2015-3 may include storage locations for data stored in other devices. In one embodiment, data memory sections 2015-0 to 2015-3 may provide more rapid access to data also stored by slower access speed memory devices. Cache data memory sections (2015-0 to 2015-3) may be formed with an architecture having a faster access time than module storage ICs. Cache data memory sections (2015-0 to 2015-3) may include random access memory (RAM) circuits. In a particular embodiment, cache data memory sections (2015-0 to 2015-3) may include SRAM memory cells, while slower access speed memory devices may be DRAMs. In another embodiment, cache data memory sections (2015-0 to 2015-3) may be SRAMs or DRAMs, and slower speed memory devices may be nonvolatile memory ICs, including but not limited to electrically erasable and programmable read only memories (EEPROMs), such as "flash" EEPROMs.

Tag blocks 2017-0 to 2017-3 may provided data values for compare operations with address values to determine if a cache hit or cache miss has occurred. That is, in response to an input value (e.g., SET), tag blocks may output a tag value for comparison with an applied tag value. Such compare operations may occur over multiple cycles, as shown in FIG. 19.

Cache controller 2052 may include circuitry for controlling functions on cache device 2046 as described for embodiments herein and equivalents. In particular embodiments, cache controller 2052 may form all or a portion of any of: cache controller 1252, 1352, 1452 of FIGS. 12 to 14, and may control operations of cache architecture as described in FIG. 19. Data input/outputs (I/O) 2019-0 to 2019-3 may provide read data paths from and write data paths into cached data memory sections 2015-0 to 2015-3.

Bus isolation circuits 2064-00 to 2064-13 may allow signals to flow into and out of cache device 2046, and in particular embodiments (e.g., look aside architectures) may allow such signals to flow through cache device 2046. In one embodiment, bus isolation circuits 2064-00 and 2064-01 may carry address and control signals into and/or through memory device 2046, while bus isolation circuits 2064-10 to 2064-13 may provide data I/O paths.

In this way, a cache device may have a centrally located cache controller, data I/Os on first opposing ends, and control and address inputs at second opposing ends.

While embodiments described herein may include standard access speed devices formed with DRAMs, and faster access devices formed with SRAMs, other embodiments may include may include standard access speed devices formed with nonvolatile memories (e.g., EEPROMs) and faster access devices formed with DRAMs.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the embodiments of impedance programming of the output driver and on-die termination and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method comprising:
receiving a memory access request associated with one or more memory modules including a first portion of a total module address space having a first access latency and including a second portion of the total module address space having a second access latency lower than the first access latency, the second portion of the total module address space corresponding to one or more high speed memory devices included in a buffer section of the one or more memory modules that buffer at least some of the total module address space, each of the one or more memory modules having first data storage locations corresponding to the first portion of the total module address space and second data storage locations corresponding to the second portion of the total module address space;
accessing, in response to the memory access request received from a memory controller, the first portion of the total module address space of the one or more memory modules after the first access latency; and accessing, in response to the memory access request received from the memory controller, the second portion of the total module address space of the one or more memory modules after the second access latency, the second portion corresponding to the buffered module address space.

2. The method of claim 1, wherein the one or more memory modules comprises first and second modules configured as chunk buffer modules each including a plurality of dynamic random access memory (DRAM) integrated circuits (ICs) having storage locations for a first portion of an address space of its module and at least one static random access memory (SRAM) IC having storage locations for a second portion of the address space for the module.

3. The method of claim 2, wherein:
the accessing of the first portion of the total module address space of the one or more memory modules after the first access latency further comprises accessing the first portion of the address space on the first module; and
the accessing of the second portion of the total module address space of the one or more memory modules after the second access latency further comprises accessing the second portion of the address space of the second module.

4. The method of claim 3, wherein:
the first and second portions of the address space of each module are programmable.

5. The method of claim 1, wherein:
the accessing of the first portion of the total module address space of the one or more memory modules after the first access latency further comprises accessing a standard memory module having a plurality of DRAM ICs; and
the accessing of the second portion of the total module address space of the one or more memory modules after the second access latency further comprises accessing a rapid channel access module having a plurality of SRAM ICs.

6. The method of claim 1 further comprising:
caching the second portion of the total module address space of the one or more memory modules.

7. The method of claim 1, wherein the accessing of the second portion of the total module address space of the one or more memory modules after the second access latency further comprises retrieving the second portion of the total module address space from a cache memory.

8. The method of claim 1, wherein the one or more memory modules comprising first and second modules are stacked IC package modules, each stacked IC module comprising a plurality of stacked IC packages, each stacked IC package including a plurality of DRAM ICs.

9. The method of claim 8, wherein the accessing of the first portion of the total module address space of the one or more memory modules after the first access further comprises accessing at least one DRAM IC of at least one of the stacked ICs of the first module.

10. A device comprising:
one or more memory modules including a first portion of a total module address space having a first access latency, and further including a second portion of the total module address space having a second access latency lower than the first access latency, the second portion of the total module address space corresponding to one or more high speed memory devices included in a buffer section of the one or more memory modules that buffer at least some of the total module address space, each of the one or more memory modules having first data storage locations corresponding to the first portion of the total module address space and second data storage locations corresponding to the second portion of the total module address space, wherein the one or more memory modules are configured to:
receive a memory access request from a memory controller associated with the one or more memory modules;
access, in response to the memory access request received from the memory controller, the first portion of the total module address space of the one or more memory modules after the first access latency; and
access, in response to the memory access request received from the memory controller, the second portion of the total module address space of the one or more memory modules after the second access latency, the second portion corresponding to the buffered module address space.

11. The device of claim 10, wherein the one or more memory modules comprises first and second modules configured as chunk buffer modules each including a plurality of dynamic random access memory (DRAM) integrated circuits (ICs) having storage locations for a first portion of an address space of its module and at least one static random access memory (SRAM) IC having storage locations for a second portion of the address space for the module.

12. The device of claim 11 wherein:
the accessing of the first portion of the total module address space of the one or more memory modules after the first access latency further comprises accessing the first portion of the address space on the first module; and
the accessing of the second portion of the total module address space of the one or more memory modules after the second access latency further comprises accessing the second portion of the address space of the second module.

13. The device of claim 12 wherein:
the first and second portions of the address space of each module are programmable.

14. The device of claim 10, wherein the one or more memory modules comprising first and second modules are stacked IC package modules, each stacked IC module comprising a plurality of stacked IC packages, each stacked IC package including a plurality of DRAM ICs.

15. The device of claim 10, wherein the one or more memory modules further comprise at least one controller circuit configured to dynamically vary a frequency of data transfer according to which portion of the module address space is being accessed.

16. The device of claim 10, wherein the one or more memory modules further comprise at least one controller circuit configured to dynamically vary a data signal voltage amplitude according to which portion of the module address space being accessed.

17. A system comprising:
a memory controller; and
one or more memory modules including a first portion of a total module address space having a first access latency, and further including a second portion of the total module address space having a second access latency lower than the first access latency, the second portion of the total module address space corresponding to one or more high speed memory devices included in a buffer section of the one or more memory modules that buffer at least some of the total module address space, each of the one or more memory modules having first data storage locations corresponding to the first portion of the total module address space and second data storage locations corresponding to the second portion of the total module address space, wherein the one or more memory modules are configured to:

receive a memory access request from the memory controller access, in response to the memory access request received from the memory controller, the first portion of the total module address space of the one or more memory modules after the first access latency; and access, in response to the memory access request received from the memory controller, the second portion of the total module address space of the one or more memory modules after the second access latency, the second portion corresponding to the buffered module address space.

18. The system of claim 17, wherein the one or more memory modules comprises first and second modules configured as chunk buffer modules each including a plurality of dynamic random access memory (DRAM) integrated circuits (ICs) having storage locations for a first portion of an address space of its module and at least one static random access memory (SRAM) IC having storage locations for a second portion of the address space for the module.

19. The system of claim 18, wherein:

the accessing of the first portion of the total module address space of the one or more memory modules after the first access latency further comprises accessing the first portion of the address space on the first module; and the accessing of the second portion of the total module address space of the one or more memory modules after the second access latency further comprises accessing the second portion of the address space of the second module.

20. The system of claim 17, wherein the one or more memory modules comprising first and second modules are stacked IC package modules, each stacked IC module comprising a plurality of stacked IC packages, each stacked IC package including a plurality of DRAM ICs.

* * * * *